US008958449B2

(12) United States Patent
Harasaka et al.

(10) Patent No.: US 8,958,449 B2
(45) Date of Patent: Feb. 17, 2015

(54) SURFACE-EMITTING LASER DEVICE, SURFACE-EMITTING LASER ARRAY, OPTICAL SCANNING APPARATUS AND IMAGE FORMING APPARATUS

(71) Applicants: Kazuhiro Harasaka, Miyagi (JP); Shunichi Sato, Miyagi (JP); Naoto Jikutani, Miyagi (JP)

(72) Inventors: Kazuhiro Harasaka, Miyagi (JP); Shunichi Sato, Miyagi (JP); Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/134,718

(22) Filed: Dec. 19, 2013

(65) Prior Publication Data

US 2014/0105647 A1 Apr. 17, 2014

Related U.S. Application Data

(63) Continuation of application No. 13/887,778, filed on May 6, 2013, now Pat. No. 8,649,407, which is a continuation of application No. 13/127,845, filed as application No. PCT/JP2009/070087 on Nov. 24, 2009, now Pat. No. 8,483,254.

(30) Foreign Application Priority Data

Nov. 27, 2008 (JP) .................................. 2008-302450
May 21, 2009 (JP) .................................. 2009-122907

(51) Int. Cl.
*H01S 5/00* (2006.01)
*G03G 15/04* (2006.01)
(Continued)

(52) U.S. Cl.
CPC ............... *G03G 15/04* (2013.01); *B82Y 20/00* (2013.01); *H01S 5/18391* (2013.01);
(Continued)

(58) Field of Classification Search
CPC ............. H01S 5/00; H01S 5/18; H01S 5/183; H01S 5/18305; H01S 5/18308; H01S 5/18325; H01S 5/18347; H01S 5/18369; H01S 5/18377; H01S 5/22
USPC .................................. 372/43.01, 46.01, 50.12
See application file for complete search history.

(56) References Cited

U.S. PATENT DOCUMENTS 5,043,994 A * 8/1991 Ikeda et al. ................. 372/45.01
5,727,014 A 3/1998 Wang et al.
(Continued)

FOREIGN PATENT DOCUMENTS

EP 1130720 A1 9/2001
EP 1876679 A1 1/2008
(Continued)

OTHER PUBLICATIONS

Japanese official action dated Sep. 18, 2013 in corresponding Japanese patent application No. 2013-087937.
(Continued)

*Primary Examiner* — Dung Nguyen
(74) *Attorney, Agent, or Firm* — Cooper & Dunham LLP

(57) ABSTRACT

A surface-emitting laser device configured to emit laser light in a direction perpendicular to a substrate includes a p-side electrode surrounding an emitting area on an emitting surface to emit the laser light; and a transparent dielectric film formed on an outside area outside a center part of the emitting area and within the emitting area to lower a reflectance to be less than that of the center part. The outside area within the emitting area has shape anisotropy in two mutually perpendicular directions.

8 Claims, 41 Drawing Sheets

(51) Int. Cl.
  *B82Y 20/00* (2011.01)
  *H01S 5/183* (2006.01)
  *G02B 26/10* (2006.01)
  *H01S 5/18* (2006.01)
  *H01S 5/32* (2006.01)
  *H01S 5/34* (2006.01)
  *H01S 5/42* (2006.01)

(52) U.S. Cl.
  CPC .......... *G02B 26/10* (2013.01); *H01S 5/18* (2013.01); *H01S 5/18311* (2013.01); *H01S 5/18347* (2013.01); *H01S 5/1835* (2013.01); *H01S 5/18355* (2013.01); *H01S 5/18358* (2013.01); *H01S 5/3202* (2013.01); *H01S 5/3403* (2013.01); *H01S 5/423* (2013.01)
  USPC .......... 372/43.01; 372/46.01; 372/50.12; 372/50.124

(56) References Cited

U.S. PATENT DOCUMENTS

| | | | |
|---|---|---|---|
| 5,923,691 | A | 7/1999 | Sato |
| 5,939,733 | A | 8/1999 | Sato |
| 6,002,700 | A | 12/1999 | Sato |
| 6,072,196 | A | 6/2000 | Sato |
| 6,207,973 | B1 | 3/2001 | Sato et al. |
| 6,233,264 | B1 | 5/2001 | Sato |
| 6,320,893 | B1 | 11/2001 | Ueki |
| 6,542,528 | B1 | 4/2003 | Sato et al. |
| 6,563,851 | B1 | 5/2003 | Jikutani et al. |
| 6,614,821 | B1 | 9/2003 | Jikutani et al. |
| 6,639,931 | B1 | 10/2003 | Dowd et al. |
| 6,674,785 | B2 | 1/2004 | Sato et al. |
| 6,927,412 | B2 | 8/2005 | Takahashi et al. |
| 2002/0074546 | A1* | 6/2002 | Sekine ............ 257/52 |
| 2002/0172247 | A1 | 11/2002 | Sopra et al. |
| 2002/0179929 | A1 | 12/2002 | Takahashi et al. |
| 2003/0006429 | A1 | 1/2003 | Takahashi et al. |
| 2003/0026308 | A1 | 2/2003 | Iwai et al. |
| 2003/0053501 | A1 | 3/2003 | Sekiya et al. |
| 2005/0083981 | A1 | 4/2005 | Kaneko et al. |
| 2005/0100068 | A1 | 5/2005 | Jikutani et al. |
| 2005/0147143 | A1 | 7/2005 | Jikutani |
| 2006/0093006 | A1 | 5/2006 | Jikutani |
| 2007/0014324 | A1 | 1/2007 | Maeda et al. |
| 2007/0280322 | A1 | 12/2007 | Sato et al. |
| 2008/0008219 | A1 | 1/2008 | Mochizuki |
| 2008/0055672 | A1 | 3/2008 | Watanabe et al. |
| 2008/0056321 | A1 | 3/2008 | Motomura et al. |
| 2008/0212636 | A1 | 9/2008 | Sato et al. |
| 2008/0233017 | A1 | 9/2008 | Sato et al. |
| 2008/0279229 | A1 | 11/2008 | Suzuki et al. |
| 2009/0022199 | A1 | 1/2009 | Jikutani et al. |
| 2009/0129417 | A1 | 5/2009 | Maeda et al. |
| 2009/0262770 | A1 | 10/2009 | Itoh et al. |
| 2009/0295902 | A1 | 12/2009 | Sato et al. |
| 2010/0060712 | A1 | 3/2010 | Sato et al. |
| 2010/0214633 | A1 | 8/2010 | Sato et al. |
| 2011/0115872 | A1 | 5/2011 | Harasaka et al. |

FOREIGN PATENT DOCUMENTS

| | | |
|---|---|---|
| EP | 2323231 A1 | 5/2011 |
| JP | 9-172218 | 6/1997 |
| JP | 11-121867 | 4/1999 |
| JP | 2001-24277 | 1/2001 |
| JP | 2003-115634 | 4/2003 |
| JP | 2003-332683 | 11/2003 |
| JP | 3566902 | 6/2004 |
| JP | 2004-241422 | 8/2004 |
| JP | 2004-289033 | 10/2004 |
| JP | 2005-86170 | 3/2005 |
| JP | 2006-196852 | 7/2006 |
| JP | 2006-210429 | 8/2006 |
| JP | 3955925 | 5/2007 |
| JP | 2007-201398 | 8/2007 |
| JP | 2007-318064 | 12/2007 |
| JP | 2008-16824 | 1/2008 |
| JP | 2008-262125 | 10/2008 |
| JP | 2008-283028 | 11/2008 |
| JP | 2010-153768 | 7/2010 |
| JP | 2011-66125 | 3/2011 |

OTHER PUBLICATIONS

Korean official action dated Mar. 28, 2013 (including English translation) in corresponding Korean patent application No. 10-2011-701 1668.

Japanese official action dated Dec. 10, 2012 in connection with corresponding Japanese patent application No. 2009-122907.

European search report dated Jul. 27, 2012 in corresponding European patent application No. 09 82 9185.

International Search Report and Written Opinion in PCT/JP2009/070087.

* cited by examiner

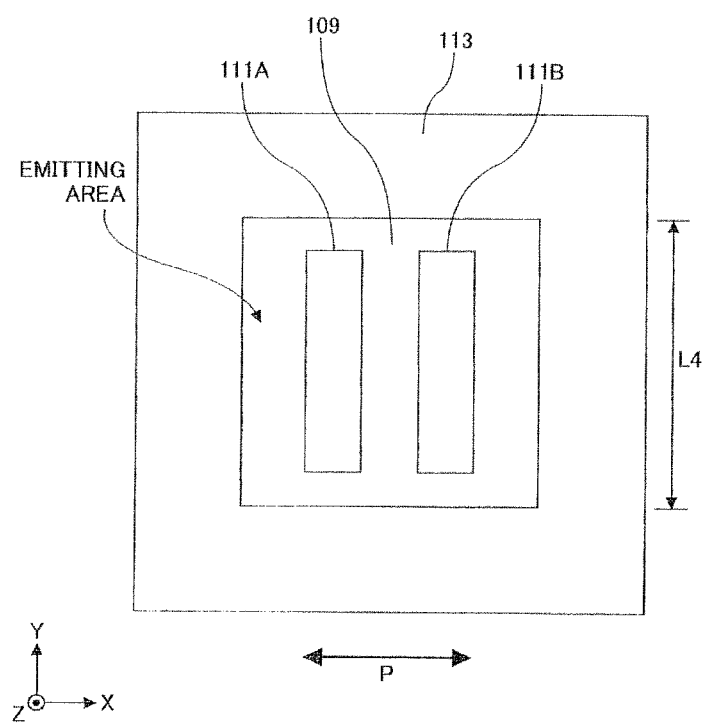

SURFACE-EMITTING LASER DEVICE, SURFACE-EMITTING LASER ARRAY, OPTICAL SCANNING APPARATUS AND IMAGE FORMING APPARATUS

CROSS-REFERENCE TO RELATED APPLICATIONS

This patent application is a Rule 1.53(b) continuation of application Ser. No. 13/887,778 filed on May 6, 2013 which is in turn a Rule 1.53(b) continuation of application Ser. No. 13/127,845 (now U.S. Pat. No. 8,483,254) filed on May 5, 2011 as a Section 371 of PCT/JP2009/070087 filed on Nov. 24, 2009, claiming priority of Japanese Patent Applications Nos. 2007-202385 and 2008-154521 filed with the Japanese Patent Office on Nov. 27, 2008 and May 21, 2009, respectively.

TECHNICAL FIELD

The present invention relates to surface-emitting laser devices, surface-emitting laser arrays, optical scanning apparatuses and image forming apparatuses. More specifically, the present invention relates to a surface-emitting laser device and a surface-emitting laser array that emit laser light in a direction perpendicular to a substrate, an optical scanning apparatus including the surface-emitting laser device or the surface-emitting laser array, and an image forming apparatus including the optical scanning apparatus.

BACKGROUND ART

A vertical cavity surface-emitting laser device emits light in a direction perpendicular to a substrate, which has attracted attention in recent years because the vertical cavity surface-emitting laser device is less expensive, lower in power consumption, smaller in size and more suitable for a two-dimensional device than an edge emitting type semiconductor laser device that emits light in a direction parallel to its substrate.

Application fields of the surface-emitting laser device may include a light source for an optical writing system in a printer (which has an oscillation wavelength in the 780 nm band), a light source for writing in a light disk apparatus (which has an oscillation wavelength in the 1.3 μm band or in the 850 nm), and a light source for an optical transmission system such as a LAN (i.e., Local Area Network) using an optical fiber (which has an oscillation wavelength in the 1.3 μm or in the 1.5 μm band). Furthermore, the surface-emitting laser device is expected to be applied to a light source for optical transmission between boards, within a board, between chips in a LSI (i.e., Large Scale Integrated circuit) and within a chip in a LSI.

In these application fields, light emitted from a surface-emitting laser device (which may be called "emitted light" hereinafter) is often needed (1) to have a round cross-sectional shape, and (2) to have a constant polarization direction.

To make the cross-sectional shape of the emitted light round, controlling a high-order transverse mode oscillation is necessary. To do this, various approaches have been tried as disclosed in Japanese Patent Publication No. 3566902 (which is hereinafter called Patent Document 1).

Also, various approaches to control the polarization direction of the emitted light have been tried as disclosed in Japanese Patent Publication No. 3955925 (which is hereinafter called Patent Document 2).

Furthermore, balancing the control of the high-order transverse mode oscillation and the control of the polarization direction has been studied as disclosed in Japanese Patent Application Publication No. 2007-201398 (which is hereinafter called Patent Document 3) and Japanese Patent Application Publication No. 2004-289033 (which is hereinafter called Patent Document 4).

However, the methods disclosed in Patent Document 1 and Patent Document 2 have difficulties in balancing the control of the high-order transverse mode oscillation and the control of the polarization direction. Moreover, the method disclosed in Patent Document 3 raises the fear that electric resistance of the surface-emitting laser device increases or that operating life duration decreases because of an increase of current density. Furthermore, the method disclosed in Document 4 has difficulty in stabilizing various characteristics of the surface-emitting laser device or a control characteristic of the high-order transverse mode.

SUMMARY OF INVENTION

Embodiments of the present invention may solve or reduce one or more of the above-described problems.

More specifically, the embodiments of the present invention may stabilize a polarization direction of emitted light while controlling a high-order transverse mode oscillation.

According to one embodiment of the present invention, a surface-emitting laser device is provided to emit laser light in a direction perpendicular to a substrate including:

a p-side electrode surrounding an emitting area on an emitting surface to emit the laser light; and a transparent dielectric film formed on an outside area outside a center part of the emitting area and within the emitting area to lower a reflectance to be less than that of the center part, wherein the outside area within the emitting area has shape anisotropy in two mutually perpendicular directions.

According to another embodiment of the present invention, there is provided a surface-emitting laser array configured to emit a plurality of laser lights in a direction perpendicular to a substrate including:

a plurality of surface-emitting laser devices integrated on the substrate;

wherein the surface-emitting laser device includes a p-side electrode surrounding an emitting area on an emitting surface to emit the laser light; and a transparent dielectric film formed on an outside area outside a center part of the emitting area and within the emitting area to lower a reflectance to be less than that of the center part;

wherein the outside area within the emitting area has shape anisotropy in two mutually perpendicular directions.

According to another embodiment of the present invention, there is provided an optical scanning apparatus configured to scan a surface to be scanned by laser light including:

a light source including a surface-emitting laser device to emit the laser light in a direction perpendicular to a substrate;

a deflection unit to deflect the laser light from the light source; and an optical scanning system to focus the laser light deflected by the deflection unit;

wherein the surface-emitting laser device includes a p-side electrode surrounding an emitting area on an emitting surface to emit the laser light; and a transparent dielectric film formed on an outside area outside a center part of the emitting area and within the emitting area to lower a reflectance to be less than that of the center part, wherein the outside area within the emitting area has shape anisotropy in two mutually perpendicular directions.

According to another embodiment of the present invention, an optical scanning apparatus is provided to scan a surface to be scanned by laser light including:

a light source including a surface-emitting laser array to emit a plurality of laser lights in a direction perpendicular to a substrate;

a deflection unit to deflect the laser lights from the light source; and an optical scanning system to focus the laser lights deflected by the deflection unit, wherein the surface-emitting laser array includes a plurality of surface-emitting laser devices integrated on the substrate, wherein the surface-emitting laser device includes a p-side electrode provided surrounding an emitting area on an emitting surface to emit the laser light; and a transparent dielectric film formed on an outside area outside a center part of the emitting area and within the emitting area to lower a reflectance to be less than that of the center part;

wherein the outside area within the emitting area has shape anisotropy in two mutually perpendicular directions.

According to another embodiment of the present invention, an image forming apparatus including:

an image holding body; and an optical scanning apparatus configured to scan the image holding body with laser light modulated according to image information, wherein the optical scanning apparatus includes a light source including a surface-emitting laser device to emit the laser light in a direction perpendicular to a substrate;

a deflection unit to deflect the laser light from the light source; and an optical scanning system to focus the laser light deflected by the deflection unit, wherein the surface-emitting laser device includes a p-side electrode surrounding an emitting area on an emitting surface to emit the laser light; and a transparent dielectric film formed on an outside area outside a center part of the emitting area and within the emitting area to lower a reflectance to be less than that of the center part, wherein the outside area within the emitting area has shape anisotropy in two mutually perpendicular directions.

According to another embodiment of the present invention, an image forming apparatus including:

an image holding body; and an optical scanning apparatus configured to scan the image holding body with laser light modulated according to image information, wherein the optical scanning apparatus includes a light source including a surface-emitting laser array to emit a plurality of laser lights in a direction perpendicular to a substrate;

a deflection unit to deflect the laser lights from the light source; and an optical scanning system to focus the laser lights deflected by the deflection unit, wherein the surface-emitting laser array includes a plurality of surface-emitting laser devices integrated on the substrate;

wherein the surface-emitting laser device includes a p-side electrode provided surrounding an emitting area on an emitting surface to emit the laser light switching; and a transparent dielectric film formed in an outside area outside a center part of the emitting area and within the emitting area to lower a reflectance than that of the center part;

wherein the outside area within the emitting area has shape anisotropy in two mutually perpendicular directions.

Other objects, features and advantages of the present invention will become more apparent from the following detailed description when read in conjunction with the accompanying drawings.

BRIEF DESCRIPTION OF DRAWINGS

FIG. 10 is an enlarged diagram of a top surface of a mesa shown in FIG. 9C;

FIG. 24 is an enlarged diagram of a top surface of a mesa in the surface-emitting laser device of the fourth modified example of;

DESCRIPTION OF EMBODIMENTS

Figure 1:
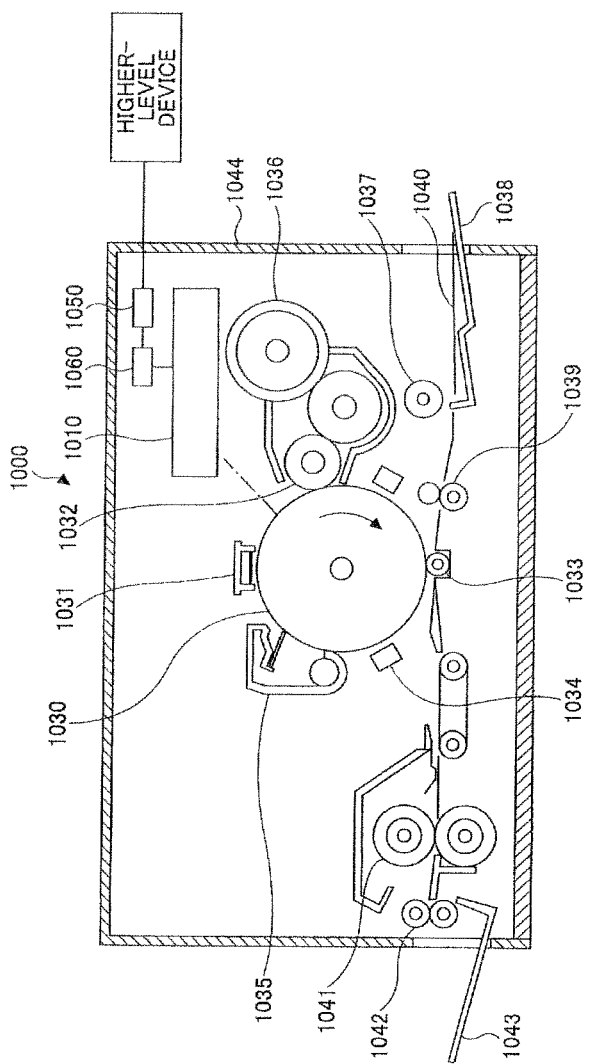
FIG. 1 is a diagram to explain an outline configuration of a laser printer of an embodiment of the present invention.

A description is given, with reference to the accompanying drawings, FIG. 1 through FIG. 30, of embodiments of the present invention. To begin with, an embodiment of the present invention is explained based on FIG. 1 through FIG. 18. FIG. 1 shows an outline configuration of a laser printer 1000 as an image forming apparatus of the embodiment of the present invention.

This laser printer 1000 includes an optical scanning apparatus 1010, a photoreceptor drum 1030, a charger 1031, a developing roller 1032, a transfer charger 1033, an electricity removal unit 1034, a cleaning unit 1035, a toner cartridge 1036, a paper feeding roller 1037, a paper feeding tray 1038, a pair of resist rollers 1039, fuser rollers 1041, paper ejection rollers 1042, a catch tray 1043, a communication control device 1050, and a printer control device 1060 for controlling these components integrally. A printer package 1044 contains these components in predetermined positions.

The communication control device 1050 controls two-way communications with a higher-level device (which includes, for example, a personal computer) through a network.

The photoreceptor drum 1030 is a cylindrical member, on a surface of which a photosensitive layer is formed. More specifically, the photoreceptor drum 1030 has a surface to be scanned. Moreover, the photoreceptor drum 1030 rotates in the direction of an arrow in FIG. 1.

The charger 1031, developing roller 1032, transfer charger 1033, electricity removal unit 1034 and cleaning unit 1035 are disposed in the neighborhood of the surface of the photoreceptor drum 1030. These components are disposed along the rotation direction of the photoreceptor drum 1030 in the following sequence: the charger 1031→the developing roller 1032→the transfer charger 1033→the electricity removal unit 1034→the cleaning unit 1035.

The charger 1031 uniformly charges the surface of the photoreceptor drum 1030.

The optical scanning apparatus 1010 scans the surface of the photoreceptor drum 1030 charged by the charger 1031 with a modulated light flux based on image information from the upper-level device, and forms a latent image corresponding to the image information on the surface of the photoreceptor drum 1030. The latent image formed here moves toward the developing roller 1032 accompanying the rotation of the photoreceptor drum 1030. A configuration of the optical scanning apparatus 1010 is described below.

The toner cartridge 1036 contains toner, and the toner is provided for the developing roller 1032.

The developing roller 1032 attaches the toner provided from the toner cartridge 1036 to the latent image formed on the surface of the photoreceptor drum 1030, and makes the image visible. Here the latent image to which the toner is attached (which is hereinafter called "the toner image" for simplicity) moves toward the transfer charger 1033 accompanying the rotation of the photoreceptor drum 1030.

The paper feeding tray 1038 contains recording paper 1040. The paper feeding roller 1037 is disposed adjacent to the paper feeding tray 1038. The paper feeding roller 1037 pulls out a sheet of recording paper 1040 from the paper feeding tray 1038, and feeds the sheet of recording paper 1040 (which is hereinafter called "the recording paper sheet 1040") to the pair of resist rollers 1039. The pair of resist rollers 1039 holds the recording paper sheet 1040 pulled out by the paper feeding roller 1037 for a moment, and sends out the recording paper sheet 1040 toward a gap between the photoreceptor drum 1030 and the transfer charger 1033, along with the rotation of the photoreceptor drum 1030.

An opposite electrical voltage to that of the toner is applied to the transfer charger 1033 to electrically attract the toner on the surface of the photoreceptor drum 1030. The toner image on the surface of the photoreceptor drum 1030 is transferred to the recording paper sheet 1040 by this applied voltage. Here the transferred recording paper sheet 1040 is conveyed to the fuser rollers 1041.

The fuser rollers 1041 apply heat and pressure to the recording paper sheet 1040, by which the toner is firmly fixed on the recording paper sheet 1040. The recording paper sheet 1040 on which the toner is fixed is carried to the catch tray 1043 through the paper ejection rollers 1042, and is stacked on the catch tray 1043.

The electricity removal unit 1034 removes electricity from the surface of the photoreceptor drum 1030.

The cleaning unit 1035 removes the toner remaining on the surface of the photoreceptor drum 1030 (i.e., residual toner). The surface of the photoreceptor drum 1030 from which the residual toner is removed returns to a position facing the charger 1031.

Next, a configuration of the optical scanning apparatus 1010 is explained.

Figure 2:
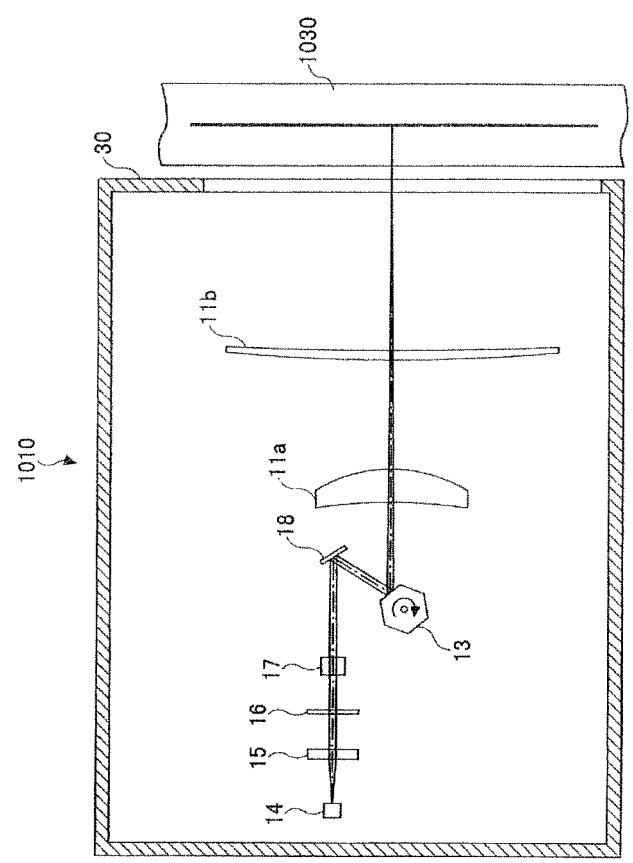
FIG. 2 is an outline diagram showing an optical scanning apparatus in FIG. 1.

This optical scanning apparatus 1010, as shown in FIG. 2 as an example, includes a deflector-side scanning lens 11a, an image-plane-side scanning lens 11b, a polygon mirror 13, a light source 14, a coupling lens 15, an aperture plate 16, an anamorphic lens 17, a reflection mirror 18, and a scanning control device (which is omitted in FIG. 2). These components are set at predetermined positions in a housing 30.

Hereinafter for simplicity, a direction corresponding to a main scanning direction is called "a main scanning corresponding direction", and a direction corresponding to a vertical scanning direction is called "a vertical scanning corresponding direction".

The coupling lens 15 makes light flux emitted from the light source 14 to be approximately parallel light flux.

The aperture plate 16 includes an opening section that shapes a beam diameter of the light flux having passed through the coupling lens 15.

The anamorphic lens 17 focuses the light flux having passed through the opening section of the aperture plane 16, and forms an image at the neighborhood of a deflecting and reflecting surface of the polygon mirror 13 in the vertical scanning corresponding direction, by way of the reflection mirror 18 from.

An optical system disposed in a light path between the light source 14 and the polygon mirror 13 is also called a before-deflector optical system. In this embodiment, the before-deflector optical system includes the coupling lens 15, aperture plane 16, anamorphic lens 17 and reflection mirror 18.

The polygon mirror 13, as an example, includes a six-sided mirror having an inscribed circle with a radius of 18 mm. Each side mirror of the six-sided mirror works as a deflecting and reflecting surface. The polygon mirror 13 deflects the light flux from the reflection mirror 18, rotating at a constant speed around an axis parallel to the vertical scanning corresponding direction.

The deflector-side scanning lens 11a is disposed in a light path of the light flux deflected by the polygon mirror 13.

The image-surface-side scanning lens 11b is disposed in a light path of the light flux transmitted via the deflector-side scanning lens 11a. By irradiating the surface of the photoreceptor drum 1030 with the light flux transmitted via the image-surface-side scanning lens 11b, an optical spot is formed on the surface of the photoreceptor drum 1030. The optical spot moves in a longitudinal direction of the photoreceptor drum 1030, accompanying the rotation of the polygon mirror 13. More specifically, the optical spot scans the surface of the photoreceptor drum 1030. A moving direction of the optical spot is the "main scanning direction". Also, the rotation direction of the photoreceptor drum 1030 is the "vertical scanning direction".

The optical system disposed in the light path between the polygon mirror 13 and the photoreceptor drum 1030 is called a scanning optical system. In the embodiment, the scanning optical system includes the deflector-side scanning lens 11a and the image-surface-side scanning lens 11b. In addition, at least a turn-back mirror may be disposed in at least one of the light paths between the deflector-side scanning lens 11a and image-surface-side scanning lens 11b, and between the image-surface-side scanning lens 11b and photoreceptor drum 1030.

Figure 3A:
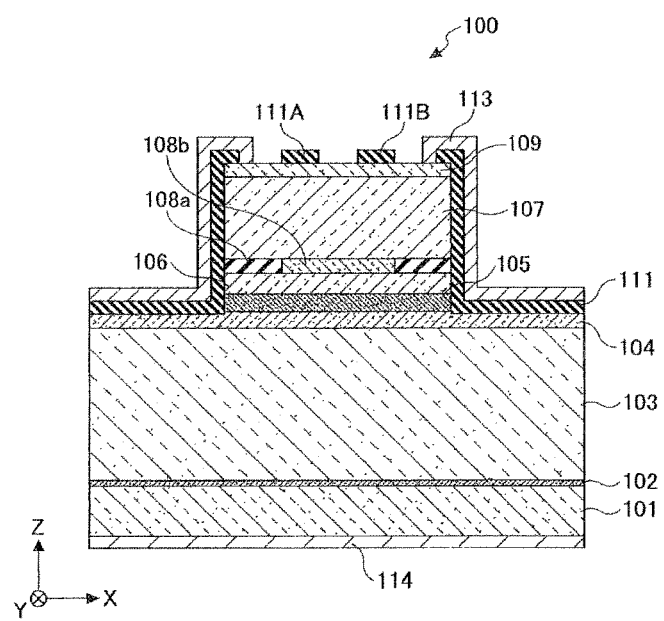
FIG. 3A is a first diagram to explain a surface-emitting laser device included in a light source.
Figure 3B:
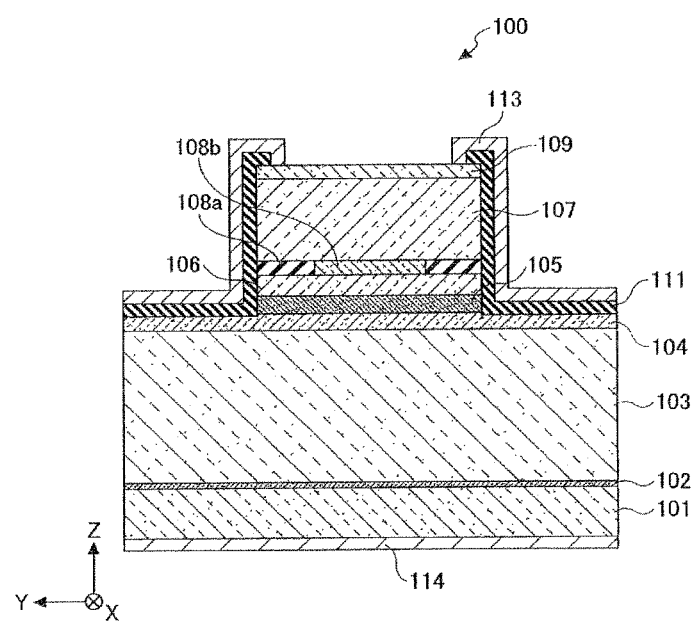
FIG. 3B is a second diagram to explain the surface-emitting laser device included in the light source viewed from a different aspect than that of FIG. 3A.

The light source 14, as shown in FIG. 3A and FIG. 3B as an example, includes a surface-emitting laser device 100. This patent specification gives an explanation by referring to a laser oscillation direction as the Z-axis direction, and by referring to two directions at right angles to each other in a plane perpendicular to the Z-axis. FIG. 3A is a diagram showing a cross-sectional view parallel to an X-Z plane of the surface-emitting laser device 100. FIG. 3B is a diagram showing a cross-sectional view parallel to a Y-Z plane of the surface-emitting laser device 100.

The surface-emitting laser device 100 emits a surface-emitting laser with an oscillation wavelength of the 780 nm band. The surface-emitting laser device 100 includes a substrate 101, a buffer layer 102, a lower part semiconductor DBR (i.e., Distributed Bragg Reflector) 103, a spacer layer 104, an active layer 105, an upper part semiconductor DBR 107, a contact layer 109 and so on.

Figure 4A:
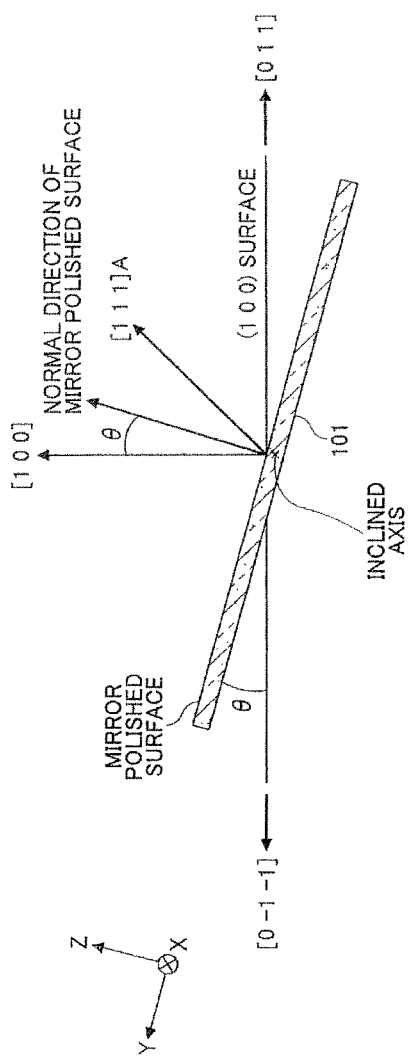
FIG. 4A is a first diagram to explain a substrate for a surface-emitting laser device.
Figure 4B:
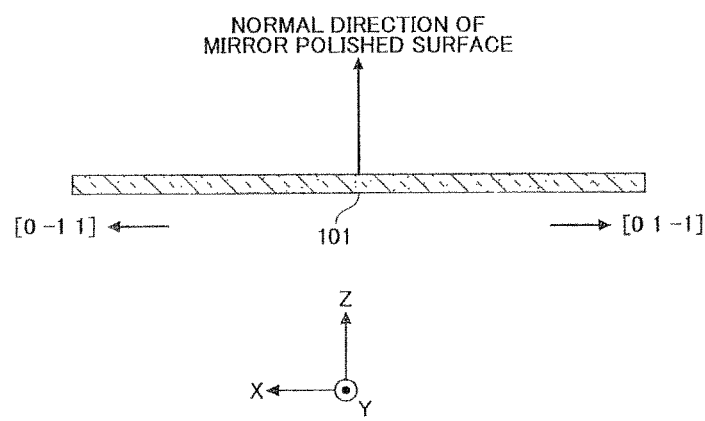
FIG. 4B is a second diagram to explain the substrate for the surface-emitting laser device viewed from a different aspect than that of FIG. 4A.

The substrate 101 has a mirror polished surface. As shown in FIG. 4A, a normal direction of the mirror polished surface (which is also called a main surface) is inclined at 15 degrees (i.e., θ=15 degree) toward A direction of a crystal orientation [1 1 1], from a crystal orientation [1 0 0]. The substrate 101 is an n-GaAs single-crystal substrate, and is a so-called inclined substrate. Here as shown in FIG. 4B, the substrate 101 is disposed so that the crystal orientation [0 −1 1] direction becomes the +X direction, and the crystal orientation [0 1 −1] direction becomes the −X direction.

In addition, by using the inclined substrate for the substrate 101, a polarization control action that tries to stabilize the polarization direction in the X-axis direction works.

As shown in FIG. 3A, the buffer layer 102 includes n-GaAs, and is stacked on a +Z-side surface of the substrate 101.

Figure 5:
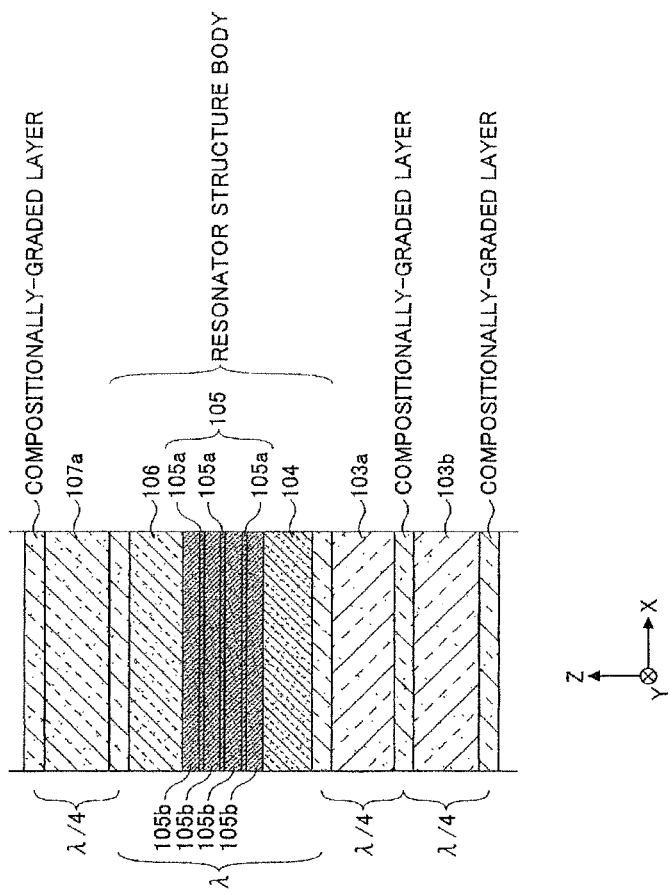
FIG. 5 is a enlarged diagram of an active layer neighborhood.

The lower part semiconductor DBR 103 is stacked on the +Z side of the buffer layer 102, and includes 40.5 pairs of a low refractive index layer including n-AlAs, and a high refractive index layer including n-$Al_{0.3}Ga_{0.7}As$. Referring to FIG. 5, compositionally-graded layers 20 nm thick whose composition gradually changes from one composition to another composition are provided between adjacent of the refractive index layers in order to reduce electric resistance. Each of the refractive index layers includes a half of adjacent layers, and is set to have an optical thickness of λ/4 if an oscillation wavelength is λ. When the optical thickness is λ/4, an actual thickness D of the layer is D=λ/4n (here n expresses the refractive index of a medium of the layer).

The lower part spacer layer 104 includes non-doped $(Al_{0.1}Ga_{0.9})_{0.5}In_{0.5}P$, and is stacked on the +Z side of the lower part semiconductor DBR 103.

The active layer 105 has a triple quantum well structure including three quantum well layers 105a and four barrier layers 105b, and is stacked on the +Z side of the lower spacer layer 104 (Refer to FIG. 5). Each of the quantum well layers 105a includes a composition of GaInAsP that induces a compression strain of 0.7%, and has an about 780 nm band gap wavelength. Also, each of the barrier layers 105b includes a composition of GaInP that induces a compression strain of 0.6%.

The upper spacer layer 106 is a layer including non-doped $(Al_{0.1}Ga_{0.9})_{0.5}In_{0.5}P$, and stacked on the +Z side of the active layer 105.

A part including the lower spacer layer 104, active layer 105 and upper spacer layer 106 is called a resonator structure body, of which thickness is set to be an optical thickness of one wavelength (Refer to FIG. 5). The active layer 105 is provided in the middle of the resonator structure body that is a position corresponding to antinodes of electric field standing wave distribution so as to obtain a high stimulated emission probability.

The upper part semiconductor DBR 107 is stacked on the +Z side of the upper spacer layer 106, and includes 23 pairs of a low refractive index layer including p-$Al_{0.9}Ga_{0.1}As$ and a high refractive index layer including p-$Al_{0.3}Ga_{0.7}As$.

Compositionally-graded layers whose composition gradually changes from one composition to another composition are provided between adjacent of the refractive index layers in the upper part semiconductor DBR 107, in order to reduce electric resistance. Each of the refractive index layers includes a half of adjacent layers, and is set to have the optical thickness of $\lambda/4$.

A selective oxidation layer 108 including p-AlAs with 30 nm thickness is inserted into one of the low refractive index layers in the upper part semiconductor DBR 107. An insertion position of the selective oxidation layer 108 corresponds to a third node from the active layer 105 in the electric field standing wave.

The contact layer 109 includes p-GaAs, and is stacked on the +Z side of the upper part semiconductor DBR 107.

Such a structure including plural of the semiconductor layers stacked on the substrate 101 is hereinafter called "a laminated body".

Next, a fabrication method of the surface-emitting laser device is explained in a straightforward way. A desired polarization direction (which is called a desired polarization direction P) is made an X-axis direction.

Figure 6A:
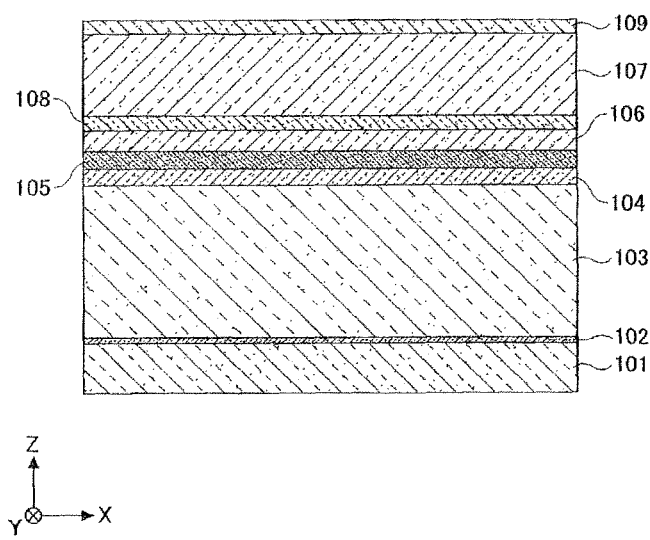
FIG. 6A is a first diagram to explain a first fabrication method of a surface-emitting laser device.

(1) The laminated body is formed by crystal growth such as metal organic chemical vapor deposition (MOCVD method) or molecular beam epitaxy (MBE method) in FIG. 6A.

Tri-methyl-aluminum (TMA), tri-methyl-gallium (TMG) and tri-methyl-indium (TMI) are used as raw materials for group 3. Phosphine ($PH_3$) and arsine ($AsH_3$) are used as raw materials for group 5. Carbon tetrabromide ($CBr_4$) and dimethylzinc (DMZn) are used as raw materials for a p-type dopant. Hydrogen selenide is used as a raw material for an n-type dopant.

(2) A resist pattern of a square shape 25 μm on a side is formed on a surface of the laminated body.

Figure 6B:
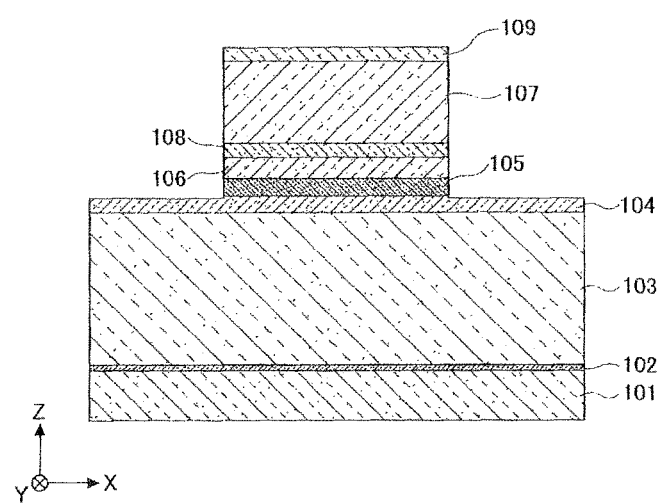
FIG. 6B is a second diagram to explain the first fabrication method of the surface-emitting laser device.

(3) A mesa structure body (which is hereinafter called "a mesa" for simplicity) of a quadrangular prism is formed by an ECR etching method using $Cl_2$ gas, using the resist pattern as a photo mask. As shown in FIG. 6B, a bottom surface of the etching is set to lie in the low part spacer layer 104.

(4) The photo mask is removed (Refer to FIG. 6B).

Figure 6C:
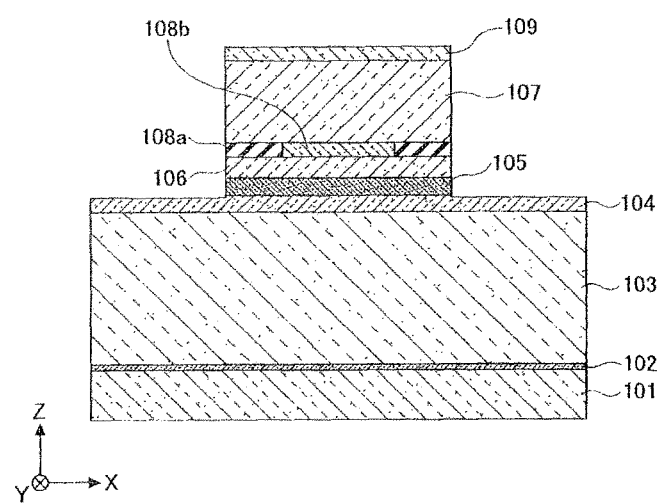
FIG. 6C is a third diagram to explain the first fabrication method of the surface-emitting laser device.

(5) The laminated body is treated with heat in water vapor. By doing this, Al (i.e., aluminum) in the selective oxidation layer 108 is selectively oxidized in an outer circumference part of the mesa, and an unoxidized area 108b remains in a central part of the mesa, as shown in FIG. 6C. More specifically, a so-called oxide-confined structure, which confines a drive current pathway of the light-emitting part to only the central part of the mesa, is formed. The unoxidized area 108b is a current passing area (i.e., a current injection area). Thus, for example, an approximately square-shaped current passing area with width from 4 μm to 6 μm is formed.

Figure 7A:
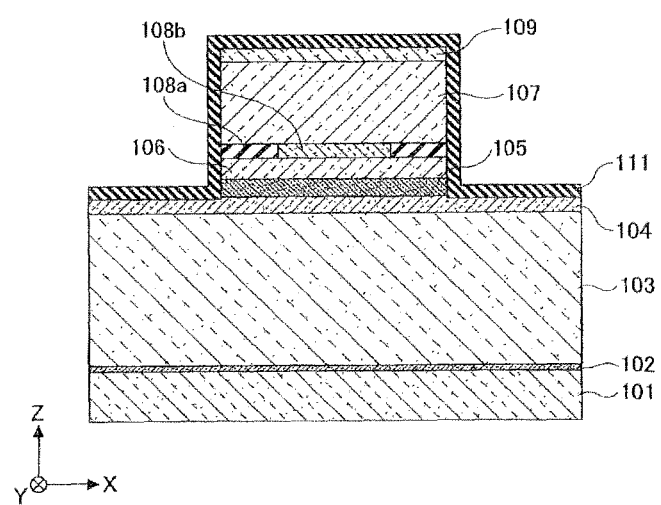
FIG. 7A is a first diagram to explain a second fabrication method of a surface-emitting laser device.
Figure 7B:
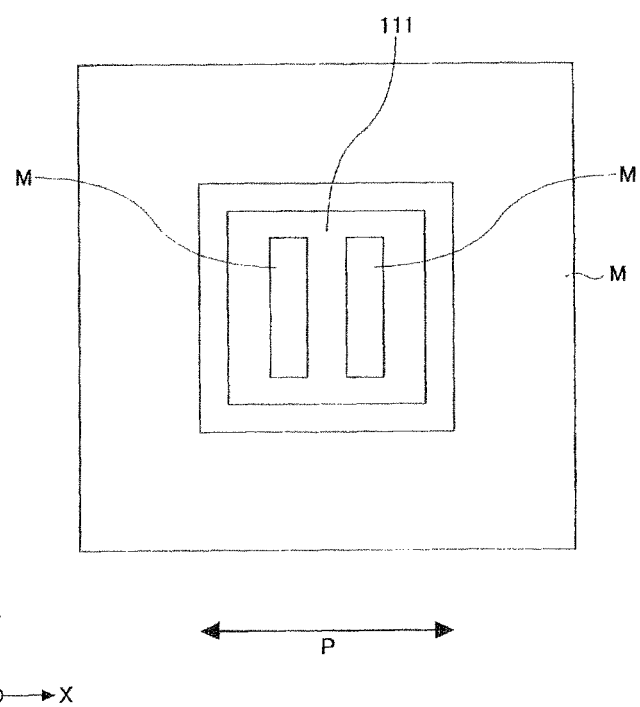
FIG. 7B is a second diagram to explain a second fabrication method of the surface-emitting laser device.

(6) A protective layer 111 including SiN is formed by using chemical vapor deposition method, as shown in FIG. 7A. An optical thickness of the protective layer 111 is set to be $\lambda/4$. In concrete terms, since the refractive index n of SiN is 1.86 and the oscillation wavelength $\lambda$ is 780 nm, the actual film thickness (which equals $\lambda/4n$) is set at about 105 nm.

Figure 8:
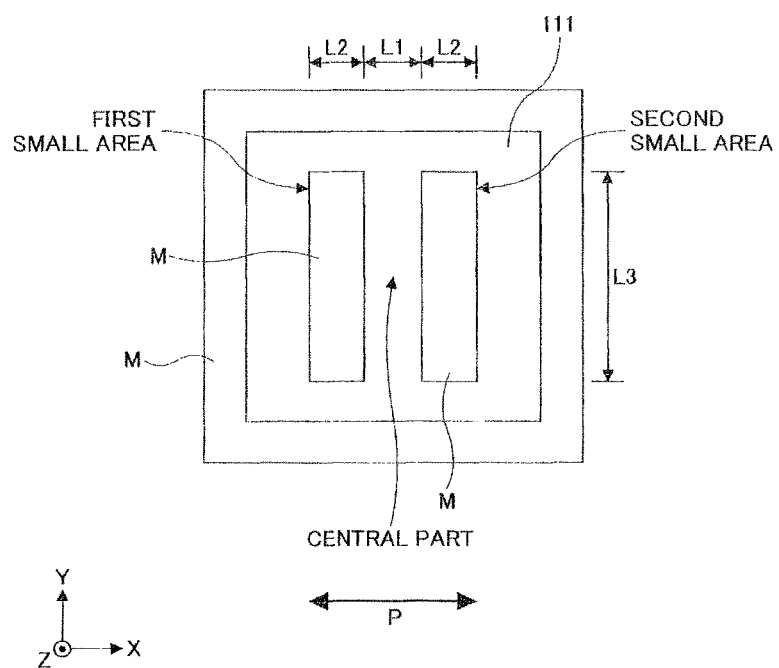
FIG. 8 is an enlarged diagram of a top surface of a mesa shown in FIG. 7B.

(7) An etching mask (which is called a mask M) to form an aperture for a p-side electrode contact is formed on an upper part of the mesa that becomes the emitting surface of the laser light. As shown in FIG. 8 that extracts and enlarges the mesa from FIG. 7A and FIG. 7B, the mask M is formed not to etch two small areas (i.e., a first small area and a second small area) facing each other in a direction parallel to a desired polarization direction P (which is an X-axis direction), across the central part of the circumference of the mesa, the circumference of the upper surface of the mesa and the upper surface of the mesa. More specifically, in FIG. 8, L1 is set at 5 μm, L2 is set at 2 μm, and L3 is set at 8 μm.

(8) The protective layer 111 is etched by BHF (i.e., Buffered Hydrofluoric acid) etching, and the aperture of the p-side electrode contact is formed.

Figure 9A:
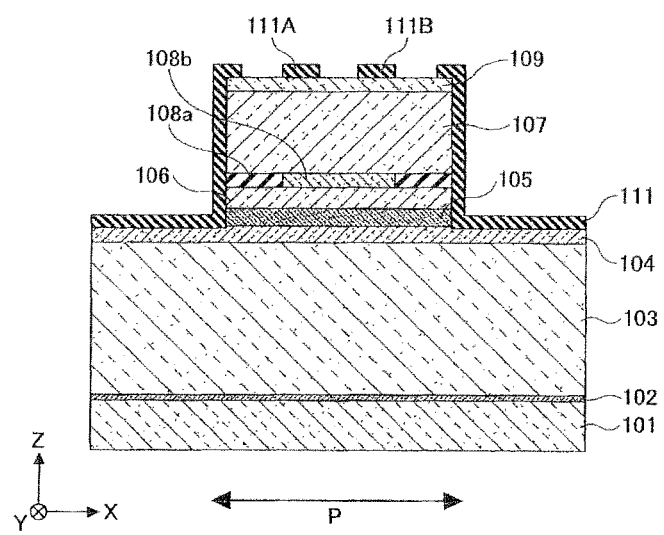
FIG. 9A is a first diagram to explain a third fabrication method of a surface-emitting laser device.
Figure 9B:
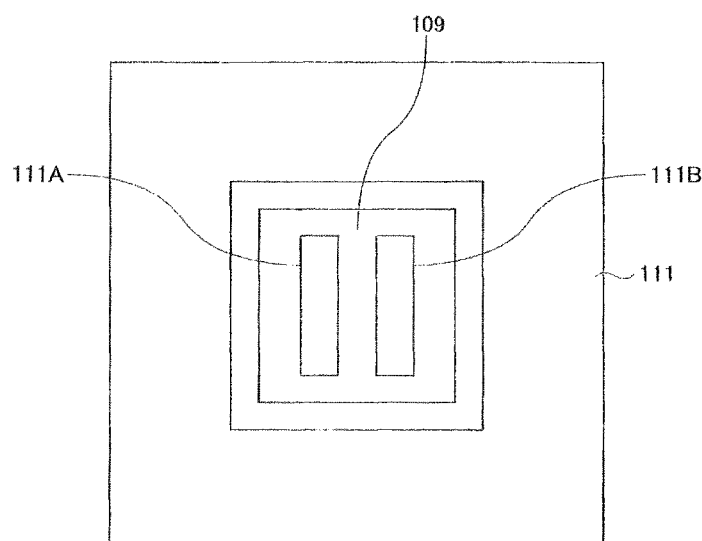
FIG. 9B is a second diagram to explain the third fabrication method of the surface-emitting laser device.

(9) As shown in FIG. 9A and FIG. 9B, the mask M is removed. Hereinafter, the protective layer 111 remaining on the first small area is called "a transparent layer 111A", and the protective layer 111 remaining on the second small area is called "a transparent layer 111B".

(10) A square resist pattern 10 μm on a side is formed in an area that is to become a light-emitting part (i.e., aperture section of a metal layer) on an upper part of the mesa, and vapor deposition of a p-side electrode material is performed. A multilayer film including Cr/AuZn/Au or Ti/Pt/Au is used as the p-side electrode material.

Figure 9C:
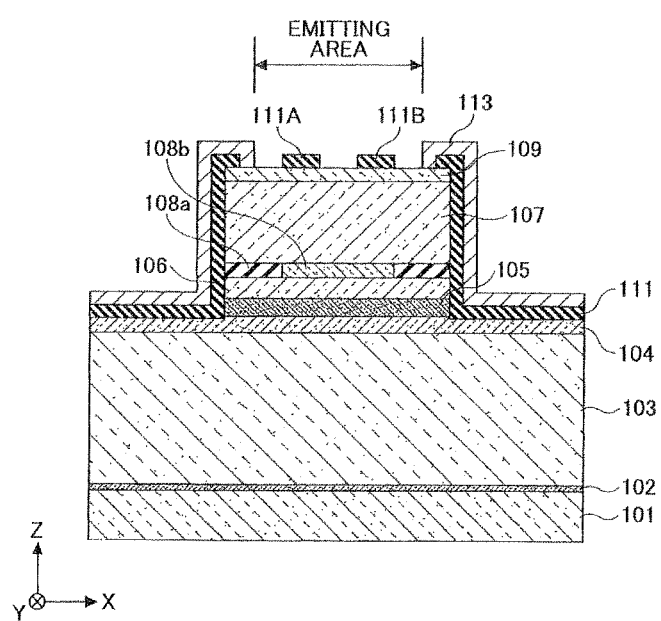
FIG. 9C is a third diagram to explain the third fabrication method of the surface-emitting laser device.

(11) As shown in FIG. 9C, a lift off technique is applied to the electrode material deposited on the area that is to become the light-emitting part (i.e., the emitting area), and a p-side electrode 113 is formed. An area surrounded by the p-side electrode 113 is the emitting area. FIG. 10 shows an enlarged diagram of the mesa extracted from FIG. 9C. A configuration of the emitting area is a square L4 on a side (which is 10 μm). In the embodiment, there are a transparent layer 111A and a transparent layer 111B as a transparent dielectric film including SiN with an optical thickness of $\lambda/4$ on two small areas (which are the first small area and the second small area). Due to this, a reflectance of the two small areas (i.e., the first small area, the second small area) is less than that of the central part of the emitting area.

Figure 11:
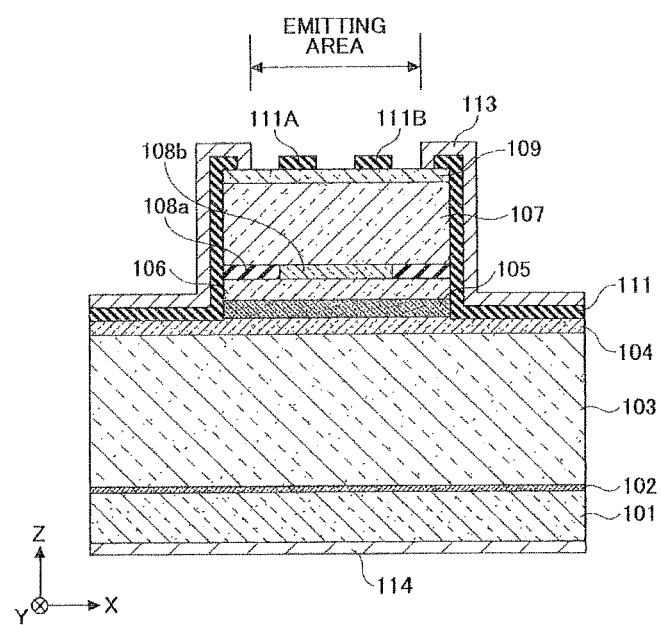
FIG. 11 is a diagram to explain a fourth fabrication method of a surface-emitting laser device.

(12) After polishing a back side of the substrate 101 until reaching a predetermined thickness (which is, for example, a degree of 100 μm), an n-side electrode 114 is formed, as shown in FIG. 11. Here the n-side electrode 114 is a multi-layer film including Au/Ni/Au.

(13) Ohmic contact between the p-side electrode 113 and the n-side electrode 114 is formed by annealing. With this, the mesa becomes the light-emitting part.

(14) Chips are cut off to be separated from each other.

Regarding the surface-emitting laser light device 100 fabricated in this way, a relationship between SMSR (i.e., Side Mode Suppression Ratio) of a high-order transverse mode when a light output is 2.0 mW, and a square measurement S of the current passing area was obtained. The result of the relationship is shown in FIG. 12 with a comparative example.

Figure 12:
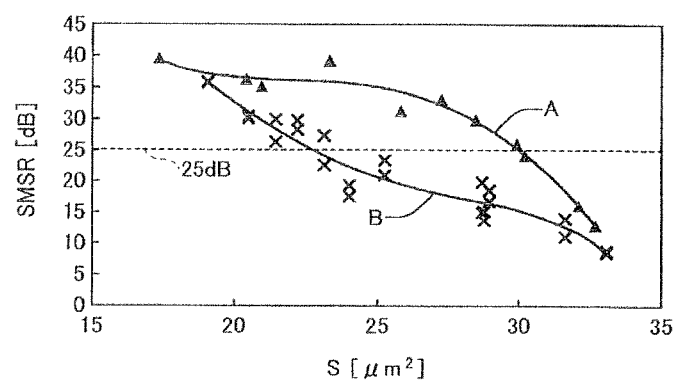
FIG. 12 is a diagram to explain a relationship between a suppression ratio SMSR of a high-order transverse mode oscillation and a square measure S of a current passing area.

A reference character A in FIG. 12 shows a characteristic curve of the surface-emitting laser device 100 of the embodiment of the present invention, and a reference character B shows a characteristic curve of a surface-emitting laser device of a comparative example, whose emitting area does not include a dielectric film. In the case of the reference character B, since the high-order transverse mode that has a peak of light output in a surrounding part of the emitting area tends to oscillate as the square measurement of the current passing area increases, the SMSR widely decreases. On the other hand, in case of the reference character A, the SMSR improves from 5 dB to 15 dB compared to the case of the reference character B. In particular, the SMSR about more than 25 dB is obtained in a range where the square measure S is less than or equal to 30 μm².

In general, the light output of the fundamental transverse mode tends to be the highest in the vicinity of the center of the emitting-area, and to decrease as a position of the light output goes far from the center. On the other hand, the light output of the high-order transverse mode tends to be the highest at a peripheral part, and to decrease as the position of the light output approaches the center. In the embodiment, reflectance of the two small areas (i.e., the first small area, the second small area) set in the peripheral part of the emitting area is set to be lower than that of the central part, which works to reduce the reflectance of the high-order transverse mode without reducing the reflectance to the fundamental transverse mode, and works to restrain the oscillation of the high-order transverse mode.

Figure 13:
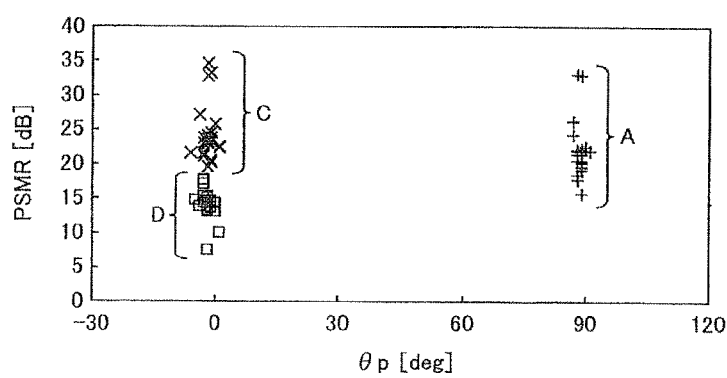
FIG. 13 is a diagram to explain a relationship between a polarization suppression ratio PMSR and a polarization angle θp.

Moreover, regarding the surface-emitting laser device 100, a relationship between PMSR (i.e., Polarization Mode Suppression Ratio) and a polarization angle θp was obtained. FIG. 13 shows the result with a comparative example. Here the polarization mode suppression ratio means a ratio of light intensity in a desired polarization direction to light intensity in a direction perpendicular to the desired polarization directions; for example, a copy machine needs a degree of 20 dB of the 1 polarization mode suppression ratio. Here a Y-axis direction means a polarization angle θp=0 degrees, and an X-axis direction means the polarization direction angle θp=90 degrees.

Figure 14:
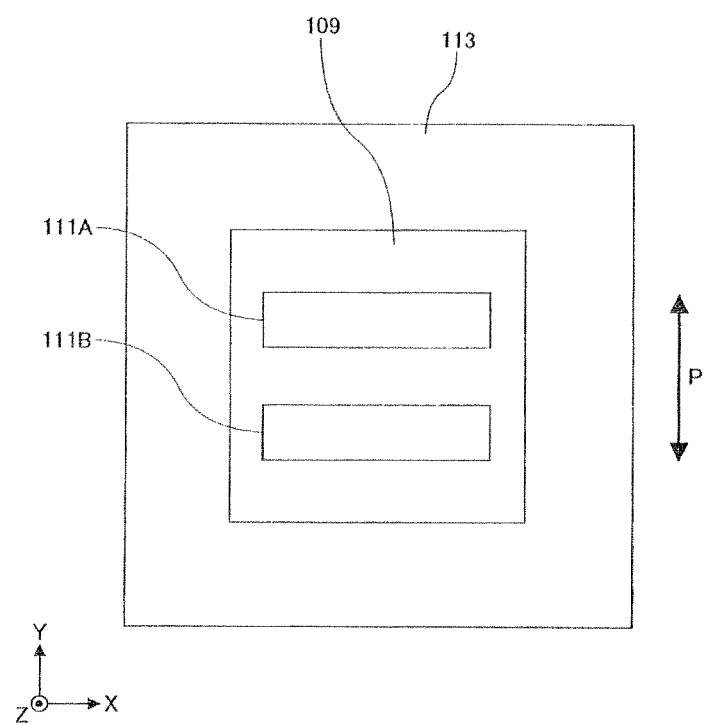
FIG. 14 is a diagram to explain a first modified example of a surface-emitting laser device.
Figure 15:
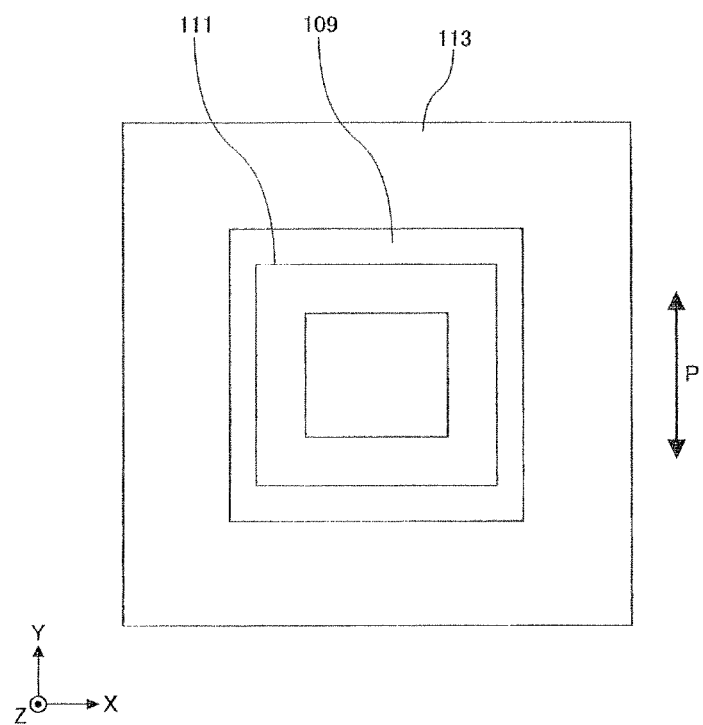
FIG. 15 is a diagram to explain a comparative example of a surface-emitting laser device.

A reference character A in FIG. 13 shows a case of the surface-emitting laser device 100 of the embodiment of the present invention. A reference character C in FIG. 13, as shown in FIG. 14 as an example, shows a modified example of a surface-emitting laser device that is equivalent to a case where the surface-emitting laser device 100 rotates 90 degrees around a Z-axis. Furthermore, a reference character D in FIG. 13, as shown in FIG. 15, shows a comparative example of a surface-emitting laser device that includes the emitting area on which a small area surrounding the central part of the emitting area is set, and includes a transparent dielectric film with an optical thickness of λ/4 formed on the small area.

As a result, in the case of the reference character A, the polarization direction stabilized in the X-axis direction. Also as a result, in the case of the reference character C, the polarization direction stabilized in the Y-axis direction. In both cases, the PMSR was more than about 5 dB higher than the case of reference character D. On the other hand, in case of the reference character D, the polarization direction stabilized in the X-axis direction, but the PMSR was lower than 10 dB and sometimes the polarization direction was unstable.

As a factor where polarization stability improved by making the plural small areas on which the transparent dielectric film was formed, it is thought that a confinement action in two mutually perpendicular directions (which are the X-axis direction and the Y-axis direction) had shape anisotropy. In the embodiment, light whose polarization direction agrees with the X-axis direction exerts the confinement action into the central part of the emitting area with higher reflectance than that of the peripheral part in the emitting area, and a vibration threshold goes down more than that of light whose polarization direction agrees with the Y-axis direction. As a result, the polarization mode suppression ratio was thought to be improved.

Figure 16:
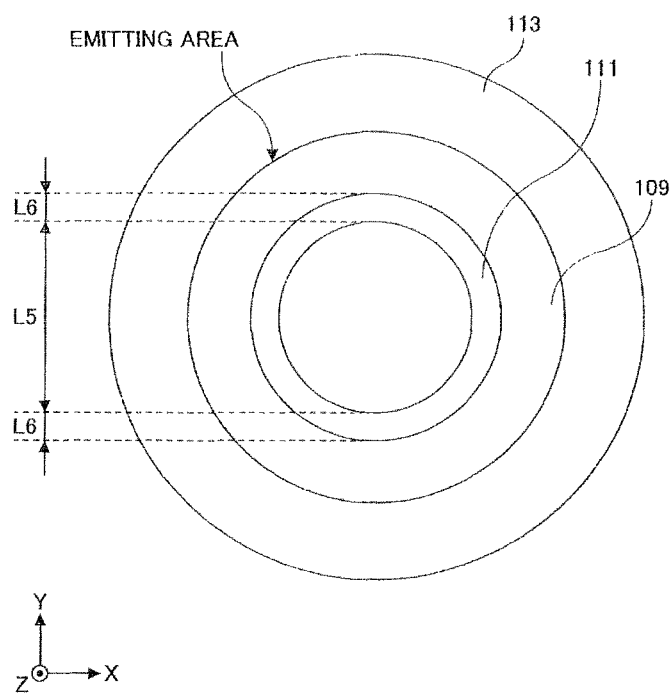
FIG. 16 is a diagram to explain a surface-emitting laser device used for calculating an oscillation mode distribution.

As an example, as shown in FIG. 16, a ring-shaped small area 111 surrounding the central part of the emitting area within the round emitting area is set, and a transparent dielectric film with an optical thickness of λ/4 is formed on the small area 111, by which a surface-emitting laser device (a calculated surface-emitting laser device) was configured. Regarding the surface-emitting laser device, while a width L6 of the small area 111 was fixed to 3 μm, an oscillation mode distribution was calculated, changing an inside diameter of the small area 111. In the calculation, the diameter of a current passing area was set as 4.5 μm. Also, in FIG. 16, the identical numerals are used for components equivalent to the surface-emitting laser device for convenience.

Figure 17:
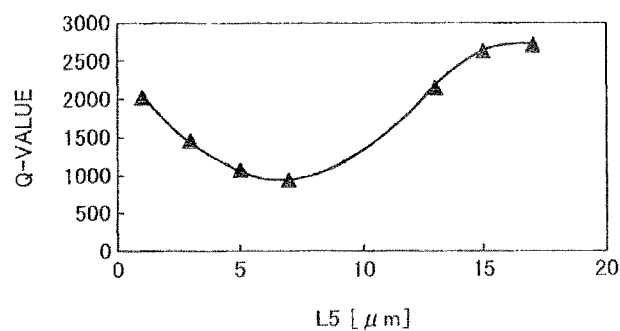
FIG. 17 is a diagram to explain a relationship between an inner diameter L5 of a small area and a Q value in a high-order transverse mode.

FIG. 17 shows a relationship between the inside diameter L5 of the small area 111 and a Q-value in high-order transverse mode, resulting from the calculations. According to this, it is noted that the Q-vale substantially decreases as the inside diameter L5 increases from 1 μm. This occurs because the high light intensity part in the high-order transverse mode overlaps the small area 111, which prevents the oscillation of the high-order transverse mode. To be more precise, setting the inside diameter L5 in a range of 5 μm to 9 μm allows the high-order mode lateral oscillation to be substantially suppressed.

Figure 18:
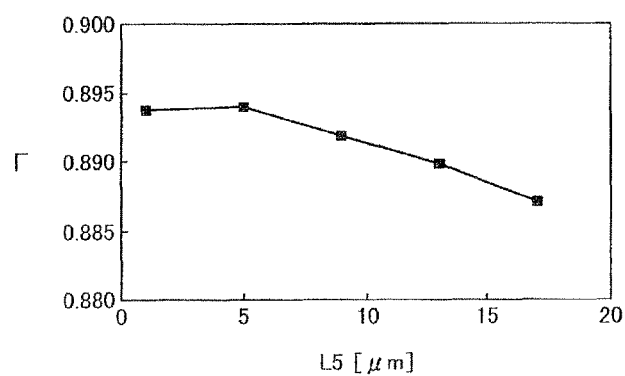
FIG. 18 is a diagram to explain a relationship between an inner diameter L5 of a small area and a light confinement factor Γ of a fundamental transverse mode in a transverse direction.

In addition, FIG. 18 shows a relationship between the inside diameter L5 of the small area 111 and a transverse light confinement factor Γ of the high-order transverse mode, resulting from the calculation. According to this, it is noted that a transverse light confinement action is intense if the inside diameter L5 is less than or equal to 5 μm, and the transverse light confinement action decreases as the inside diameter L5 increases if the inside diameter L5 is more than 5 μm. Due to this, by forming the plural small areas and by providing a distance between the small areas, shape anisotropy being applied to the transverse light confinement action becomes possible. As a result, the polarization component in a direction of the intense confinement action tends to oscillate more readily than the polarization component in a direction of the weak confinement action, which makes it possible to control the polarization direction toward the direction with the intense confinement action.

As explained above, according to the surface-emitting laser device 100 of the embodiment, the buffer layer 102, lower part semiconductor DBR 107, lower part spacer layer 104, active layer 105, upper spacer layer 106, upper part semiconductor DBR 107, and contact layer 109 are laminated on the substrate 101. Also, the surface-emitting laser device 100 includes the p-side electrode 113 provided surrounding the emitting area on the emitting surface to emit the laser light, and the n-side electrode 114 on the substrate 101 side. In addition, in the two small areas (i.e., the first small area and the second small area) outside the central part within the emitting area, the transparent layer 111A and transparent layer 111B that are optically transparent dielectric films to reduce a reflectance of each small area lower than that of the central part of the emitting area are formed at an optical thickness of λ/4.

In this case, the optically transparent film formed on the emitting surface makes the reflectance of the peripheral area of the emitting area relatively lower than that of the central area of the emitting area, which makes it possible to suppress the high-order transverse mode oscillation without reducing the light output of the fundamental transverse mode.

Moreover, the surface-emitting laser device 100 has the central part of the emitting area with a relatively high reflectance as a configuration with shape anisotropy in mutually perpendicular directions, which allows the transverse confinement action applied to the laser light to intentionally generate the shape anisotropy, and can improve stability of the polarization direction.

In other words, it is possible to control the high-order transverse mode oscillation and to stabilize the polarization direction.

Furthermore, without reducing the square measurement of the current passing area, controlling the high-order transverse mode and polarization direction is possible. This prevents resistance of the device and the current density of the current confined area from increasing, which prevents a decrease of device lifetime.

In addition, the two small areas (i.e., the first small area and second small area) in the emitting area face across the central part of the emitting area in a desired direction parallel to the polarization direction P. In this case, providing the dielectric film on each of the small areas readily and precisely is possible.

Also, the substrate 101 is a so-called inclined substrate, and a facing direction of the first small area and second small area is parallel to an inclined-axis direction (which is the X-axis direction) in a principal surface of the substrate 101. In this case, a polarization control action by using the inclined substrate is added, which can improve the stability of the polarization direction.

In addition, a side surface of the mesa is covered with the protective layer 111 of a dielectric film. In this case, destruction of the device caused by moisture absorption is prevented, which can improve long-term reliability.

According to the optical scanning apparatus 1010, the light source 14 includes the surface-emitting laser device 100. In this case, because obtaining the laser light of a single fundamental transverse mode is possible, easily forming a round and minute laser spot on the surface of the photoreceptor drum 1030 is possible. Moreover, since the polarization direction is stable, the optical scanning apparatus 1010 is immune to distortion of the light spot, light intensity fluctuation and so on. Thus, focusing a round, high-density and minute beam spot onto the photoreceptor drum 1030 and forming an image on the photoreceptor drum 1030 with a basic optical system is possible. Therefore, performing stable optical scanning becomes possible.

According to a laser printer 1000 of the embodiment, forming a high-quality image becomes possible because the laser printer 1000 includes the optical scanning apparatus 1010.

In the above-mentioned embodiment, an explanation is given about a case where use of the inclined substrate for the substrate 101 causes the polarization control action to stabilize the polarization direction in the X-axis direction. If the polarization control action to stabilize the polarization direction works in the Y-axis direction, it is also possible to set a desired polarization direction P in the Y-axis direction, and to set the direction in which the first small area and the second small area face perpendicular to the principal surface of the inclined axis direction (which is the X-axis direction), as shown in FIG. 14.

Moreover, in the embodiment, a case where the protective layer 111 is SiN is explained, but the protective layer 111 is not limited to SiN. For example, $SiN_x$, $SiO_2$, $TiO_x$ and SiON are also available. By designing a film thickness according to a refractive index of each of the materials, a similar effect can be obtained.

Furthermore, in the embodiment, an explanation is given about a case where the first small area and second small area are symmetrical about an axis running through the center of the emitting area and parallel to the Y-axis, but the configuration is not limited to this case. As long as there is a first small area on one side of an axis running through the center of the emitting area and parallel to the Y-axis, and there is a second small area on the other side of the axis, a variety of configurations are applicable.

Figure 19:
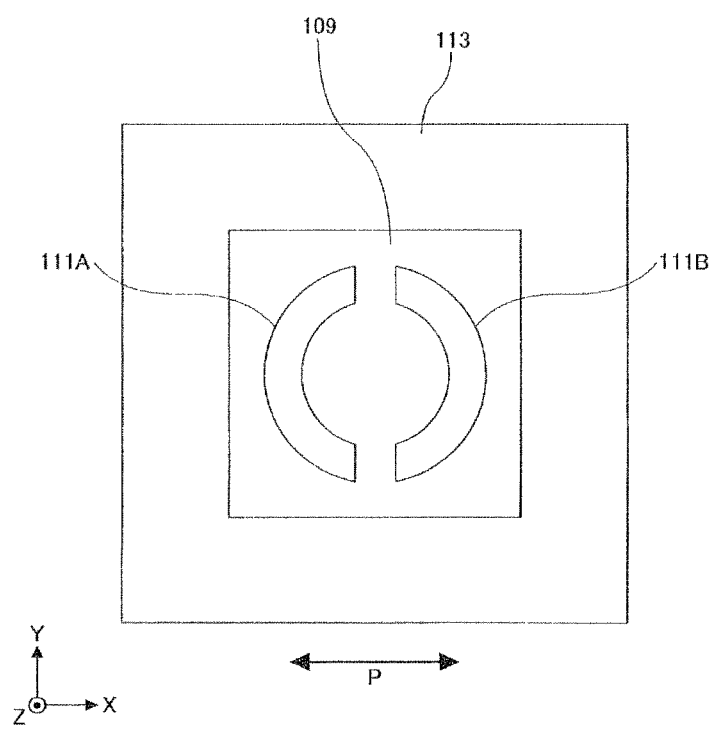
FIG. 19 is a diagram to explain a second modified example of a surface-emitting laser device.

In addition, in the embodiment, an explanation is given about a case where a configuration of each of the small areas is rectangular, but the configuration is not limited to the rectangular shape. The small areas can be an arbitrary shape including an ellipse and a semicircular shape, as shown in FIG. 19.

Also, in the embodiment, an explanation is given about a case where the transparent layer 111A and transparent layer 111B include the same material as that of the protective layer 111, but the material of the transparent layer 111A and transparent layer 111B is not limited to the same material.

Figure 20A:
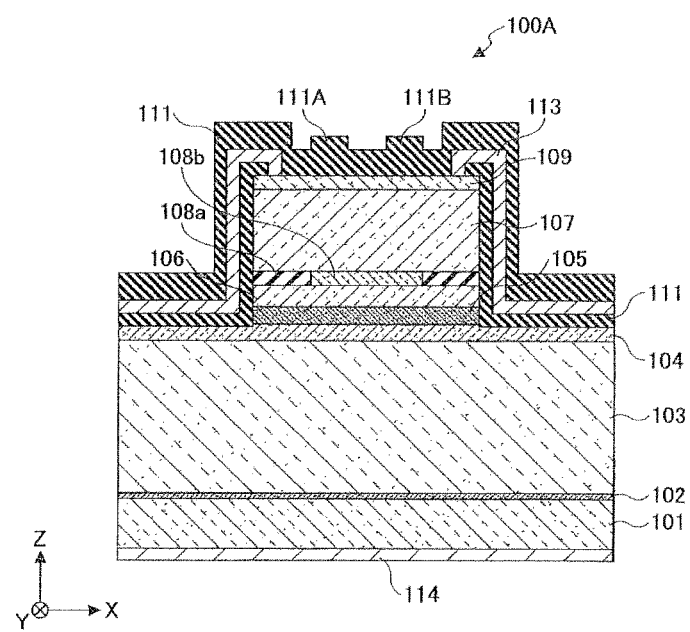
FIG. 20A is a first diagram to explain a third modified example of a surface-emitting laser device.
Figure 20B:
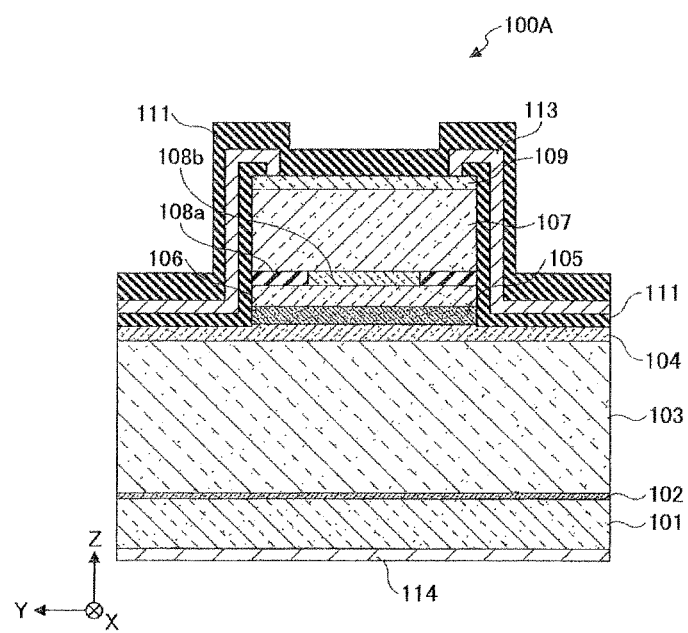
FIG. 20B is a second diagram to explain the third modified example of the surface-emitting laser device.

Moreover, in the embodiment, an explanation is given about a case where the optical thickness of the transparent layer 111A and transparent layer 111B is $\lambda/4$, but the optical thickness of the transparent layer 111A and transparent layer 111B is not limited to this case. As an example, as shown in FIG. 20A and FIG. 20B, an optical thickness of the transparent layer 111A and transparent layer 111B may be $3\lambda/4$. Basically, as long as the optical thickness of the transparent layer 111A and transparent layer 111B is an odd multiple number of $\lambda/4$, a transverse mode suppression effect similar to that of the surface-emitting laser device 100 in the embodiment can be obtained. FIG. 20A is a cross-sectional view of the surface-emitting laser device 100A cut by a plane parallel to an X-Z plane. FIG. 20B is a cross-sectional view of the surface-emitting laser device 100A cut by a plane parallel to a Y-Z plane.

Figure 21A:
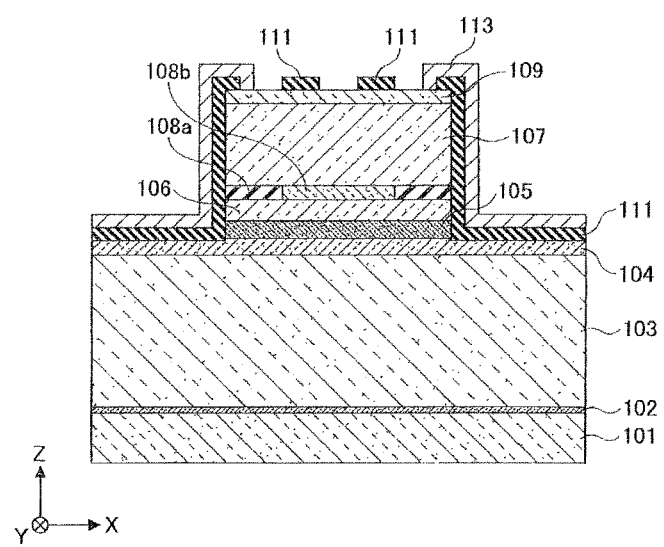
FIG. 21A is a first diagram to explain a fabrication method of the third modified example of the surface-emitting laser device.
Figure 21B:
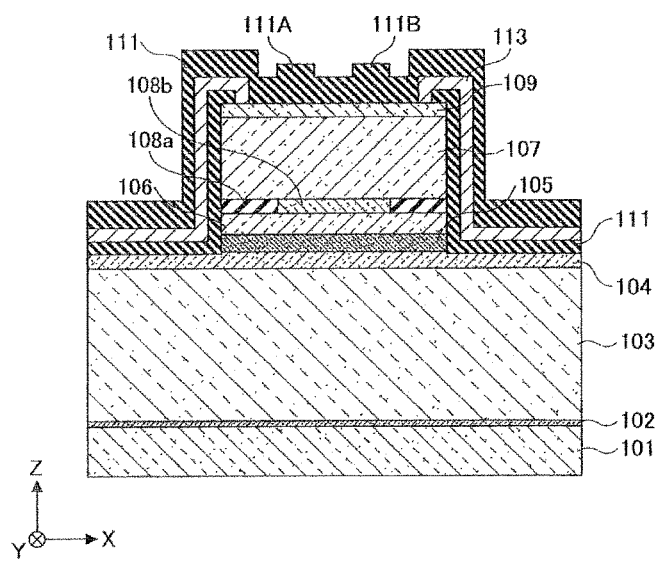
FIG. 21B is a second diagram to explain the fabrication method of the third modified example of the surface-emitting laser device.
Figure 21C:
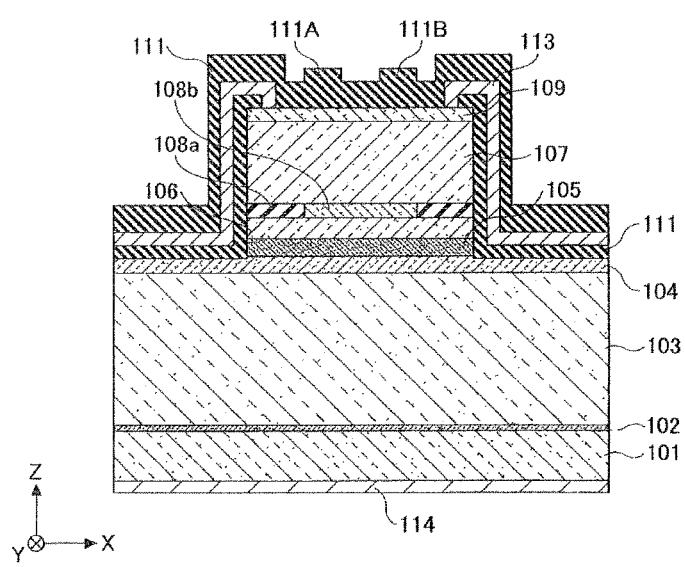
FIG. 21C is a third diagram to explain the fabrication method of third modified example of a surface-emitting laser device.

In this case, as shown in FIG. 21A as an example, a p-side electrode in the embodiment is formed. After that, as shown in FIG. 21B as an example, a protective layer 111 including SiN is formed so as to have an optical thickness of $2\lambda/4$, by using a chemical vapor deposition method. More specifically, an actual film thickness (i.e., $=2\lambda/4n$) was set at about 210 nm because the refraction index n of SiN is 1.86, and an oscillation wavelength was 780 nm. Then, as shown in FIG. 21C, after polishing the under side of the substrate 101 to a predetermined thickness (for example, a degree of 100 μm), an n-side electrode 114 was formed.

At this time, the central part of the emitting area was covered with a protective layer 111 having an optical thickness of $2\lambda/4$. In addition, the peripheral part of the emitting area except the two small areas (i.e., the first small area and second small area) was also covered with the protective film 111 (which is dielectric film) with the optical thickness of $2\lambda/4$.

With regard to the surface emitting laser device 100A, obtaining a relationship between the high-order transverse mode suppression ratio SMSR and the square measurement of the current passing area when the light output was 2.0 mW, the suppression ratio SMSR more than 25 dB was obtained in a range less than or equal to 30 μm² of the square measurement of the current passing area.

Furthermore, obtaining a relationship between the polarization mode suppression ratio PMSR and the polarization angle θp for the surface-emitting laser device 100A, the polarization direction of the light emitted from the surface-emitting laser device 100A was controlled in an X-axis direction, and a high polarization mode suppression ration PMSR was obtained at a degree of 20 dB.

In addition, in the surface-emitting laser device 100A, the whole emitting surface is covered with the protective layer 111 (i.e., dielectric film), which can prevent oxidation or contamination of the emitting area. Also, since the central part of the emitting area is covered with the protective layer 111 (i.e., dielectric film), whose optical thickness is an even multiple number of λ/2, an optical characteristic equivalent to a case where the central part of the emitting area was not covered with the protective film 111, was obtained without lowering the reflectance.

More specifically, when the optical thickness of a part whose reflectance should be lowered is an odd multiple number of λ/4, and the optical thickness of the other part is an even multiple number of λ/4, a transverse mode suppression effect similar to that of the embodiment is obtained.

Figure 22A:
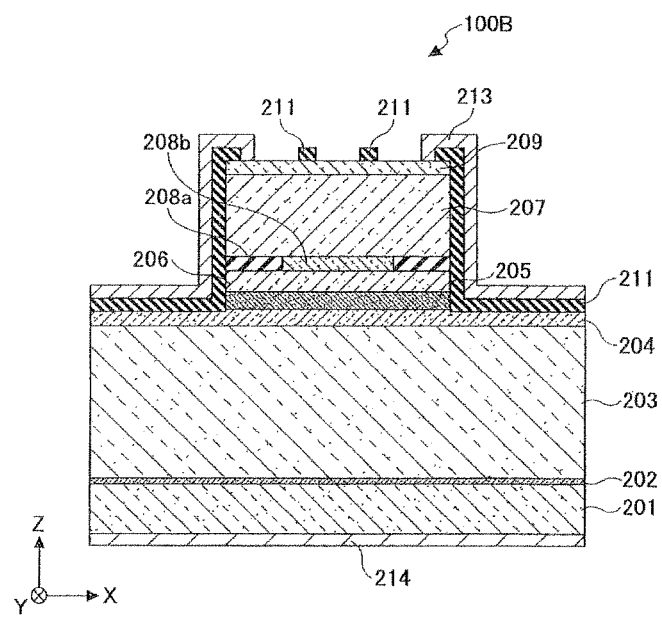
FIG. 22A is a first diagram to explain a fourth modified example of a surface-emitting laser device.
Figure 22B:
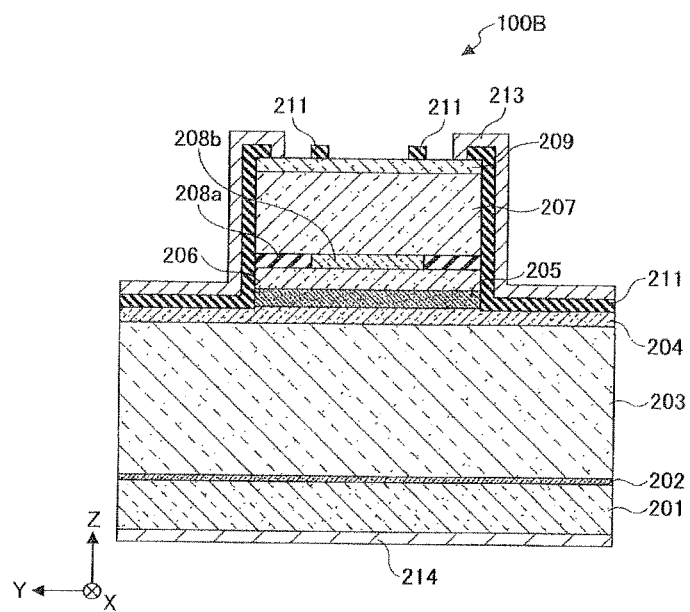
FIG. 22B is a second diagram to explain the fourth modified example of the surface-emitting laser device.

Moreover, in the embodiment, the light source 14 may include a surface-emitting laser device 100B as shown in FIG. 22A and FIG. 22B as an example, replacing the surface-emitting laser device 100.

The surface-emitting laser device 100B emits a surface-emitting laser with an oscillation wavelength in the 780 nm band, and includes a substrate 201, a buffer layer 202, a lower part semiconductor DBR 203, a lower part spacer layer 204, an active layer 205, an upper spacer layer 206, an upper part semiconductor DBR 207, a selective oxidation layer 208a, 208b and a contact layer 209.

The substrate 201 is an inclined substrate similar to the substrate 101.

The lower part semiconductor DBR 203 is laminated on the +Z side of the buffer layer 202, and includes 40.5 pairs of a low refractive index layer including n-AlAs and a high refractive index layer including n-$Al_{0.3}Ga_{0.3}As$. A compositionally-graded layer 20 nm thick whose composition gradually varies from one composition to another composition is provided between adjacent of the refractive index layers in order to reduce electric resistance. Also, each of the refractive index layers includes a half of adjacent compositionally-graded layers, and is set to have an optical thickness of λ/4 if an oscillation wavelength is λ.

The lower part spacer layer 204 is laminated on the +Z side of the lower part semiconductor DBR 203, and includes non-doped $(Al_{0.1}Ga_{0.9})_{0.9}In_{0.5}P$.

The active layer 205 is laminated on the +Z side of the lower part spacer layer 204, and is an active layer of a triple quantum well structure including three quantum well layers and four barrier layers. Each of the quantum well layers includes GaInAsP whose composition induces a compression strain of 0.7%, and has a band-gap wavelength of about 780 nm. Also, each of the barrier layers includes GaInP whose composition induces a compression strain of 0.6%.

The upper part spacer layer 206 is laminated on the +Z side of the active layer 205, and includes non-doped $(Al_{0.1}Ga_{0.9})_{0.5}In_{0.5}P$.

A part including the lower spacer layer 204, the active layer 205 and the upper part spacer layer 206 is also called a resonator structure body, whose thickness is set to be an optical thickness of a wavelength. In addition, the active layer 205 is provided in the middle of the resonator structure body corresponding to antinodes of a standing wave distribution in an electric field so as to obtain a highly stimulated emission probability.

The upper part semiconductor DBR 207 includes a first upper part semiconductor DBR and a second upper part semiconductor DBR (which are not shown in FIG. 22A and FIG. 22B).

The first upper part semiconductor DBR is laminated on the +Z side of the upper part spacer layer 206, and includes a pair of a low refractive index layer including p-$(Al_{0.7}Ga_{0.3})_{0.5}In_{0.5}$, and a high refractive index layer including p-$(Al_{0.1}Ga_{0.9})_{0.5}In_{0.5}$. A compositionally-graded layer gradually varying from one composition to another composition is provided between adjacent of the refractive index layers to reduce electric resistance. Here each of the refractive index layers includes a half of adjacent compositionally-graded layers, and is set to be an optical thickness of λ/4.

The second upper part semiconductor DBR is laminated on +Z side of the first upper part semiconductor DBR, and includes 23 pairs of a low refractive index layer including p-$Al_{0.9}Ga_{0.1}As$ and a high refractive index layer including p-$Al_{0.9}Ga_{0.7}As$. A compositionally-graded layer gradually varying from one composition to another composition is provided between adjacent of the refractive index layers to reduce electric resistance. Each of the refractive index layers includes a half of adjacent compositionally-graded layers, and is set to be an optical thickness of λ/4.

The selective oxidation layer 208a, 208b including p-AlAs 30 nm thick is inserted into one of the low refractive index layers in the second upper part semiconductor DBR. More specifically, the first upper part semiconductor DBR, a very thin layer, is located below the selective oxidation layer 208a, 208b. An insert position of the selective oxidation layer 208a, 208b corresponds to the third node from the active layer 205 of the standing wave distribution in the electric field.

The contact layer 209 is laminated on the +Z side of the second upper part semiconductor DBR, and includes p-GaAs.

Such a thing where plural of the semiconductor layers are laminated on the substrate 201 is hereinafter called "a laminated body B" for simplicity.

Next, a fabrication method of the surface-emitting laser device 100B is briefly explained. Here a desired polarization direction P is made an X-axis direction.

(1) The laminated body B is formed by crystal growth such as metal-organic chemical vapor deposition method (i.e., MOCVD method) and molecular beam epitaxy method (i.e., MBE method).

(2) A resist pattern of a square 25 µm on a side is formed on a surface of the laminated body B.

(3) A mesa shaped in a quadrangular prism is formed by ECR etching method using $Cl_2$ gas. Here a bottom surface for etching is set to be in the lower part spacer 204.

(4) A photo mask is removed.

(5) The laminated body B is treated with heat in water vapor. By doing this, Al (i.e., aluminum) in the selective oxidation layer 208a, 208b is selectively oxidized in the peripheral part, and an unoxidized area 208b surrounded by the Al oxidation layer 208a remains in central part of the mesa. More specifically, a so-called oxide-confined structure body that confines a drive current path of a light-emitting part to the central part of the mesa is formed. The unoxidized area 208b is a current passing area (i.e., a current injection area). Thus, for example, an approximately square-shaped current passing area with a degree of 4 µm to 6 µm in width is formed.

(6) A protective layer 211 including SiN is formed by a chemical vapor deposition method (i.e., CVD method). Here an optical thickness of the protective layer 211 is set to be λ/4. To be more precise, since the refractive index n of SiN is 1.86 and an oscillation wavelength λ is 780 nm, an actual film thickness (i.e., =λ/4) is set at about 105 nm.

Figure 23:
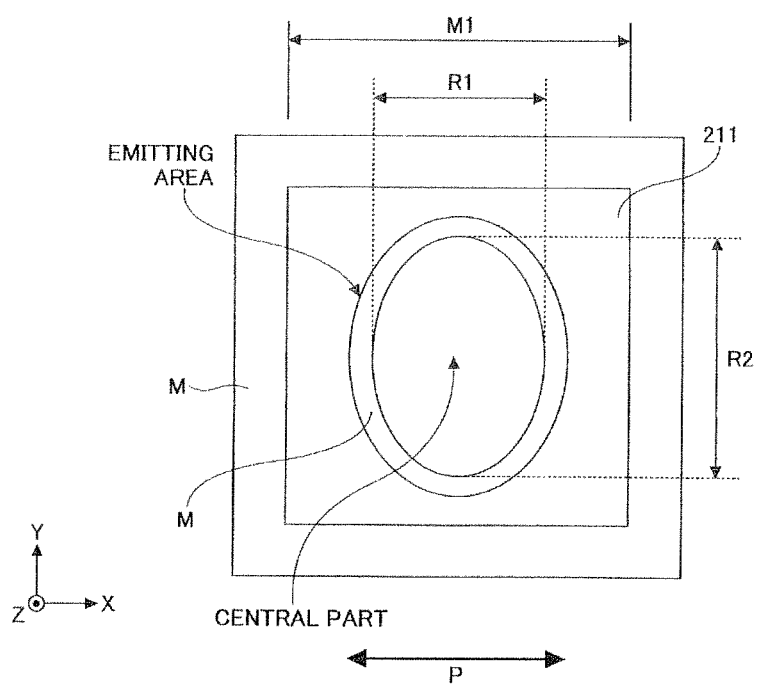
FIG. 23 is an enlarged diagram of a top surface of a mesa in a fabrication process of the surface-emitting laser device of the fourth modified example.

(7) An etching mask (which is also called a mask M) is formed to form an aperture of a p-side electrode contact on an upper surface of the mesa to become an emitting surface of laser light. Here as an example as shown in FIG. 23, extracting and enlarging only the mesa, the mask is formed surrounding the periphery of the mesa, the periphery of the upper surface of the mesa and the central part of the upper surface of the mesa, not so as to etch an annular area whose minor axis direction is parallel to a desired polarization direction P (which is the X-axis direction). More specifically, in FIG. 23, a reference character R1 is 6 μm, a reference character R2 is 7 μm, and a reference character M1 is 10 μm.

(8) The protective layer 211 is etched by BHF, and the aperture for the p-side electrode contact is formed.

(9) The mask M is removed.

(10) A resist pattern shaped in a square 10 μm on a side is formed in an area that is to be a light-emitting area (i.e., an aperture section of a metal layer) on the upper part of the mesa, and the p-side electrode material is deposited. A multiple layer film including Cr/AuZn/Au or Ti/Pt/Au is used as the p-side electrode material.

Figure 24:
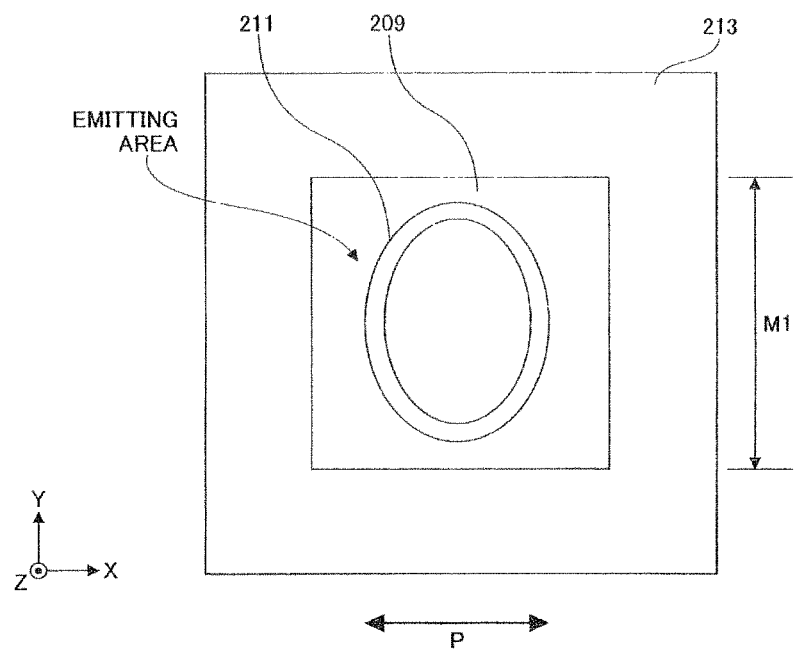

(11) A p-side electrode 213 is formed by a lift off technique that removes unnecessary parts of the p-side electrode material deposited on the area that is to become a light-emitting part (i.e., an emitting area). FIG. 24 shows a diagram due to extracting and enlarging only the mesa. An area surrounded by the p-side electrode 213 is an emitting area. A configuration of the emitting area is a square M1 on a side (which is 10 μm). There is a transparent layer 211 as a transparent dielectric film of SiN with an optical thickness of λ/4 on the annular area in the emitting area. This makes reflectance of the annular area lower than that of the central part of the emitting area.

(12) After polishing the under side of the substrate 201 to a predetermined thickness (for example, a degree of 100 μm), an n-side electrode 214 is formed. Here the n-side electrode 214 is a multilayer film including AuGe/Ni/Au.

(13) Ohmic contact is formed by annealing to connect the p-side electrode 213 and the n-side electrode 214. This makes the mesa a light-emitting part.

(14) Each of chips are cut and separated.

In the surface-emitting laser device 100B fabricated as described above, the reflectance of the peripheral part leaving the SiN film λ/4n thick is lower than that of the central part in the emitting area. In general, the light output of a fundamental transverse mode tends to be the highest in the vicinity of the central part of the emitting area, and to decrease far from the central part. On the other hand, a light output of the fundamental transverse mode tends to be the highest in the peripheral part, and to decrease close to the central part of the emitting area. Therefore, in the surface-emitting laser device 100B, it is possible to reduce the reflectance of the high-order transverse mode without reducing the fundamental transverse mode. More specifically, action suppressing the high-order transverse mode oscillation works.

Figure 25:
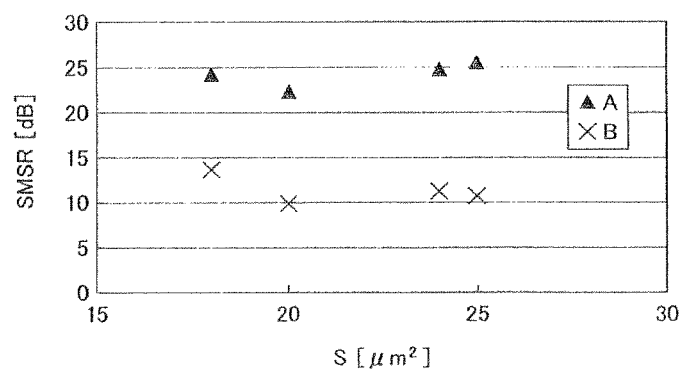
FIG. 25 is a diagram to explain a relationship between the existence or nonexistence of a suppression structure of a high-order transverse mode and a suppression ratio SMSR of a high-order transverse mode.

FIG. 25 shows a comparative result of a high-order transverse mode suppression mode ratio when the light output is 1.4 mV between a device with a high-order transverse mode suppression structure similar to that of the surface-emitting laser device 100B (which is shown in a reference character A) and a device without the high-order transverse mode suppression structure (which is shown in a reference character B). Here a transverse axis S is a square measurement of a current passing area. In the device without the high-order transverse mode suppression structure, SMSR is substantially low because the high-order transverse mode with a peak of light output in a peripheral part of the emitting area tends to oscillate. In contrast, in the device with the high-order transverse mode suppression structure, SMSR improves more than 10 dB compared to the device with the high-order transverse mode control structure, and SMSR improved more than 20 dB is obtained in a range where the measurement square S of the current passing area is less than 30 mm$^2$.

Figure 26:
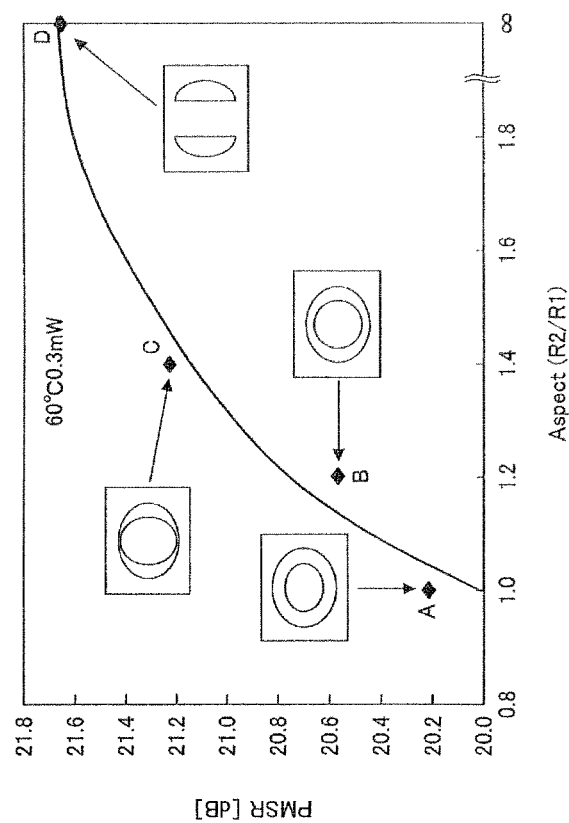
FIG. 26 is a diagram to explain a relationship between R2/R1 and a polarization mode suppression ratio PMSR.

Moreover, FIG. 26 shows a relationship between R2/R1 (here R1 is an inside radius in a direction parallel to the polarization direction, and R2 is a radius in a direction perpendicular to the polarization direction) and a polarization mode suppression ratio (i.e., PMSR). In FIG. 26, a point A shows a case of R1=R2=5 μm. A point B shows a case of R1=5 μm and R2=6 μm. A point C shows a case of R1=5 μm and R2=7 μm. A point D shows a case where R1=5 μm and the protective layer (low reflectance area) is divided into two.

Since use of the inclined substrate creates shape anisotropy of gain, the polarization directions of all four structures face in the X-axis direction without depending on configurations of low reflectance areas. However, comparing the polarization mode suppression ratios showing stability of the polarization, a result of improving the polarization mode suppression ratio is obtained as the ratio of the inside diameter (i.e., R2) in a direction perpendicular to the polarization direction to the inside diameter (i.e., R1) in a direction parallel to the polarization direction is higher.

As a factor causing such a result, it is thought that the light confinement action in two directions perpendicular to each other had the shape anisotropy. In points R and C, since the light confinement action into the central part in the X-axis direction of the polarization direction became stronger than that in the Y-axis direction, an oscillation threshold of light waves with the polarization composition in the X-axis direction decreased, and the polarization stability improved better than the point A of a structure with an isotropic diameter. Also, in a structure of a point D that divides the low reflectance area into plural parts, the polarization mode suppression ratio improved the best among the points, which is similar to the surface-emitting laser device 100.

Figure 27A:
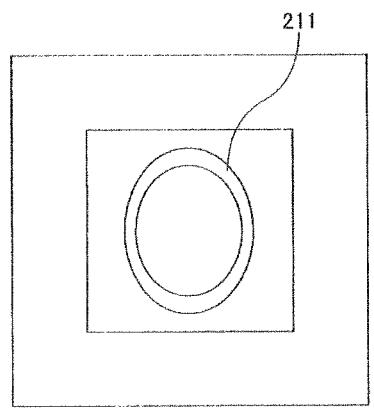
FIG. 27A is a first diagram to explain a configuration of a low reflectance area.
Figure 27B:
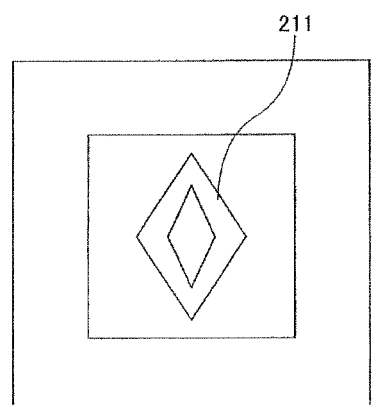
FIG. 27B is a second diagram to explain a configuration of a low reflectance area.
Figure 27C:
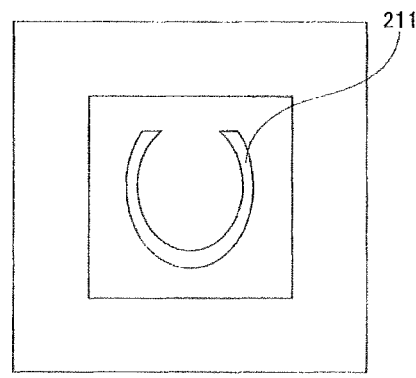
FIG. 27C is a third diagram to explain a configuration of a low reflectance area.
Figure 27D:
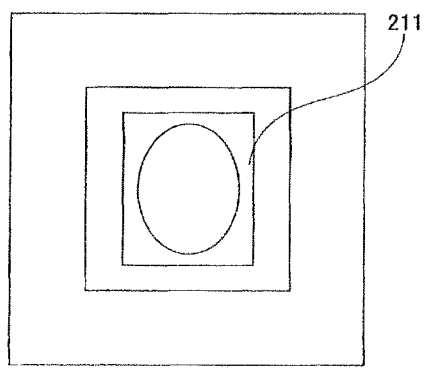
FIG. 27D is a fourth diagram to explain a configuration of a low reflectance area.
Figure 27E:
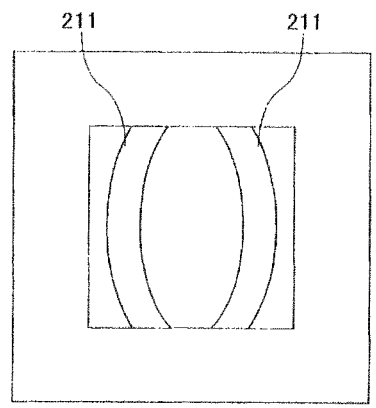
FIG. 27E is a fifth diagram to explain a configuration of a low reflectance area.
Figure 27F:
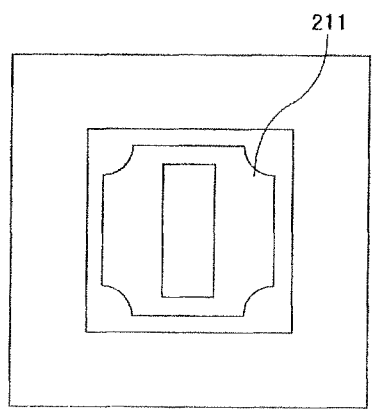
FIG. 27F is a sixth diagram to explain a configuration of a low reflectance area.

In addition, as shown in FIG. 27A though FIG. 27F, the configuration of the low reflectance area is not limited to the annular shape of an ellipse including a major axis and a minor axis, and any configuration such as rectangle can also obtain a transverse mode suppression effect and polarization control effect similar to the above-discussed embodiment.

Figure 28:
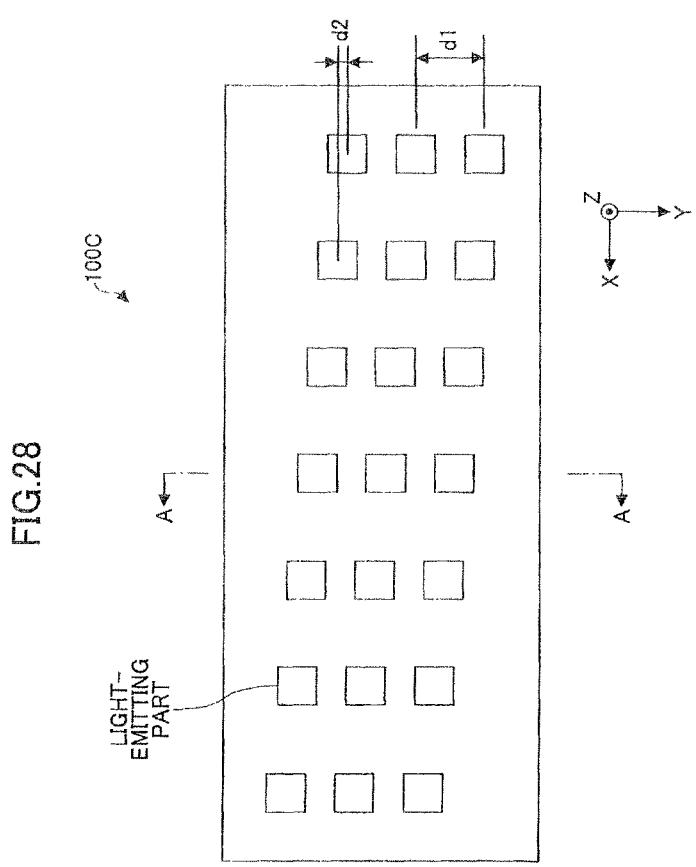
FIG. 28 is a diagram to explain a surface-emitting laser array.

Moreover, as an example, the light source 14 may include a surface-emitting laser array 100C shown in FIG. 28, replacing the surface-emitting laser device 100.

The surface-emitting laser array 100C includes plural of light emitting parts (21 parts in FIG. 28) arranged on a common substrate. In FIG. 28, an X-axis direction is a main scanning corresponding direction, and a Y-axis is a vertical scanning corresponding direction. Plural of the light-emitting parts are arranged at equal spacing when all of the light-emitting parts are orthographically projected along a virtual line extending in the Y-axis direction. In other words, the 21 light-emitting parts are arranged in a two-dimensional way. In addition, in the patent specification, "a light-emitting part space" means a distance between centers of two light-emitting parts. Also, the number of light-emitting parts is not limited to 21.

Figure 29:
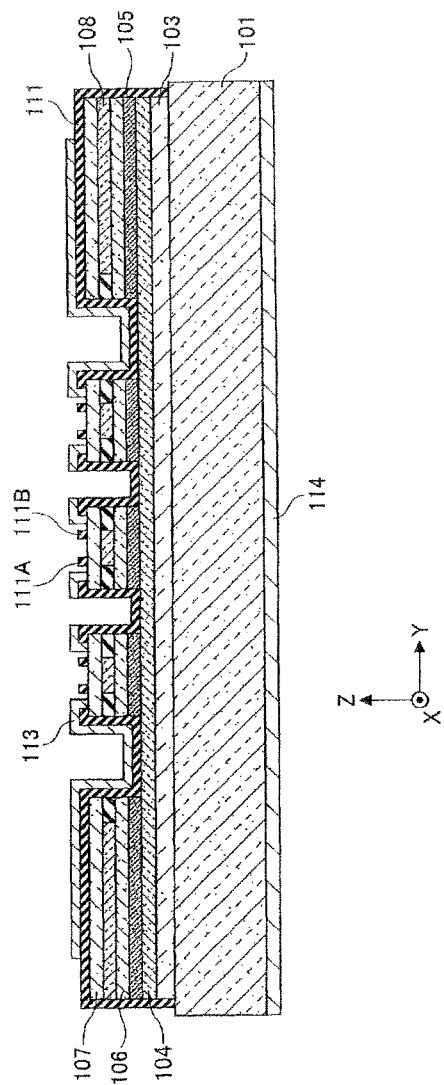
FIG. 29 is a cross-sectional diagram cut along A-A' line in FIG. 28.

As shown in FIG. 29 that shows a cross-sectional view of FIG. 28 along the line A-A, each of the light-emitting parts has a similar structure to that of the surface-emitting laser device 100. Moreover, the surface-emitting laser device 100C can be fabricated in a method similar to that of the surface-emitting laser device 100. Thus, it is possible to obtain plural single-fundamental-transverse-mode laser light beams with a uniform polarization direction among the light-emitting parts. Therefore, it is possible to form 21 round, light-dense and minute light spots on the photoreceptor drum 1030 at the same time.

Furthermore, in the surface-emitting laser array 100C, since the light-emitting part spacing is an equal distance d2 when the light-emitting parts are orthographically projected along the vertical line extending in the vertical direction, by adjusting a timing of lighting, the surface-emitting laser array 100C can be treated as a case where the light-emitting parts are arranged at equal spacing in the vertical direction on the photoreceptor drum 1030.

In addition, for example, by setting the distance d2 at 2.65 μm, and a magnification ratio of an optical system of the optical scanning apparatus 1010 at double, high-density writing of 4800 dpi (i.e., dot/inch) is possible. Of course, by increasing the number of light-emitting parts in the main scanning corresponding direction, by making an array arrangement that reduces the distance d2, narrowing a pitch d1 in the vertical scanning corresponding direction, and by reducing the magnification ratio of the optical system, making density higher and printing with higher quality are possible. In addition, the writing space in the main scanning corresponding direction can be readily controlled based on the lighting timing of the light-emitting part.

Furthermore, in this case, the laser printer 1000 can print without reducing printing speed even if the writing dot density is increased. In addition, in the case of the same writing dot density, increasing the printing speed further is possible.

Moreover, in this case, since the polarization directions of the light fluxes from the light-emitting parts stably agree, the laser printer 1000 can stably form a high-quality image.

It is desirable that a trench between two adjacent light-emitting parts be more than or equal to 5 μm for electric and spatial separation. This is because controlling etching during fabrication becomes difficult if the trench is too narrow. Furthermore, it is desirable that the size of the mesa (which means length of a side) be more than or equal to 10 μm. This is because there is concern that heat may be retained in the mesa, and the characteristic may degrade if the size is too small.

In addition, in the above-mentioned embodiment, a surface-emitting laser array including one-dimensionally aligned light-emitting parts similar to the surface-emitting laser device 100 may be available, replacing the surface-emitting laser device 100.

Since the surface-emitting laser device 100 is integrated, it is possible to stabilize the polarization direction, while controlling the high-order transverse mode oscillation.

Moreover, in the embodiment, an explanation is given about a case where the normal direction of the principal surface of the substrate is inclined at 15 degrees toward a crystal orientation [1 1 1] direction A, from a crystal orientation [1 0 0] direction, but the embodiment is not limited to that case. As long as the normal direction of the substrate is inclined toward one of directions of a crystal orientation <1 1 1>, from one of directions of a crystal orientation <1 0 0>, an inclination of any numbers of degrees is possible.

Furthermore, in the above-discussed embodiment, a case where the oscillation wavelength of the light-emitting part is in the 780 nm band is explained, but the embodiment is not limited to that case. The oscillation wavelength of the light-emitting part is changeable according to the characteristics of the photoreceptor.

In addition, the above-mentioned surface-emitting laser devices are available for applications other than image forming. In this case, the oscillation wavelength may be in bands including the 650 nm band, 850 nm band, 980 nm band, 1.3 μm band and 1.5 μm band, according to the application. In this case, a mixed crystal semiconductor material according to the oscillation wavelength may be used as the semiconductor material constituting the active layer. For example, AlGaInP-based mixed crystal semiconductor material for the 650 nm band, InGaAs-based mixed crystal semiconductor material for the 980 nm band, and GaInNAs(Sb)-based mixed crystal semiconductor material for the 1.3 μm band and 1.5 μm band can be used.

Moreover, by selecting a material and configuration of the reflection mirrors according to the oscillation wavelength, the light-emitting part corresponding to any oscillation wavelength can be formed. For example, a material other than AlGaAs mixed crystal such as AlGaInP mixed crystal can be used. Furthermore, it is desirable that the low refractive index layer and the high refractive index layer be transparent to the oscillation wavelength, and capable of making a refractive index difference between them as much as possible.

In addition, in the embodiment, a case of the laser printer 1000 as the image forming apparatus is explained, but the image forming apparatus is not limited to the laser printer 1000.

For example, an image forming apparatus that directly emits laser light onto a medium (for example, a sheet of paper) colored by laser light is also possible.

Also, an image forming apparatus using sliver salt film as an image holding body is possible. In this case, a latent image is formed on the silver salt film by light scanning, and the latent image can be visualized in an equivalent process to development in a usual silver halide photography process. Then, an equivalent process to printing in the usual silver halide photography process makes it possible to transfer the visible latent image to a photographic paper sheet. Such an image forming apparatus is put into practice as a light print-making apparatus or a light drawing apparatus that draws an image such as a computed tomography scan image.

Figure 30:
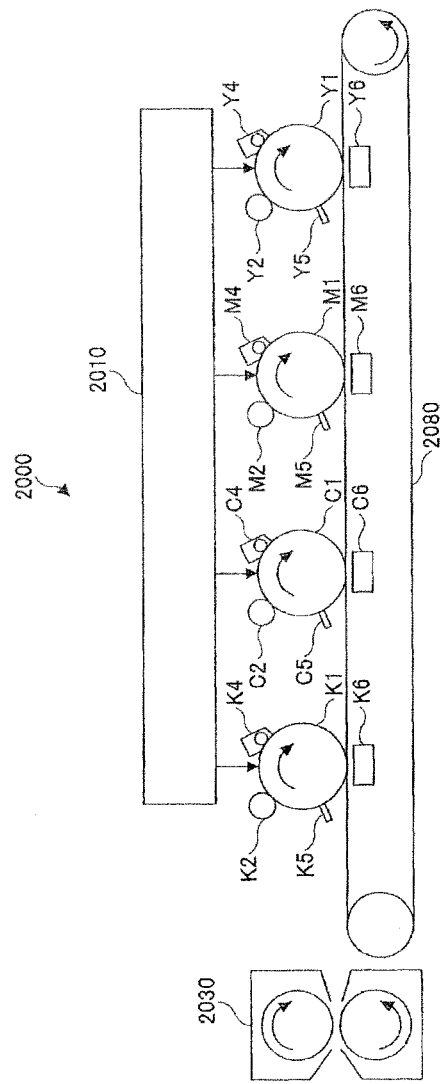
FIG. 30 is a diagram to explain an outline configuration of a color printer.

Moreover, as shown in FIG. 30 as an example, a color printer 2000 including plural photoreceptor drums is also possible.

The color printer 2000 is a tandem type multicolor printer that forms a full-color image by combining four colors (which includes black, cyan, magenta and yellow). The color printer 2000 includes a photoreceptor drum K1, charger device K2, development device K4, cleaning unit K5 and transfer device K6 for black; a photoreceptor drum C1, charger device C2, development device C4, cleaning unit C5 and transfer device C6 for cyan; a photoreceptor drum M1, charger device M2, development device M4, cleaning unit M5 and transfer device M6 for magenta; and a photoreceptor drum Y1, charger device Y2, development device Y4, cleaning unit Y5 and transfer device Y6 for yellow. Also, the color printer 2000 includes an optical scanning device 2010, a transfer belt 2080 and a fixing unit 2030.

The photoreceptor drums K1, C1, M1, Y1 rotate in the direction of arrows in FIG. 30. The charger devices K2, C2, M2, Y2, the development devices K4, C4, M4, Y4, and cleaning units K5, C5, M5, Y5 are arranged around the respective photoreceptor drums K1, C1, M1, Y1 along the rotation direction. The charger devices K2, C2, M2, Y2 uniformly charge the surfaces of the corresponding photoreceptor drums K1, C1, M1, Y1. The optical scanning apparatus 2010 emits light onto the surfaces of the photoreceptor drums K1, C1, M1, Y1, charged by the charger devices K2, C2, M2, Y2, and forms the latent images on the respective photoreceptor drums K1, C1, M1, Y1. The corresponding development devices K4, C4, M4, Y4 form toner images on the surfaces of the photoreceptor drums K1, C1, M1, Y1. Furthermore, the transfer devices K4, C4, M4, Y4 transfer the toner images of the corresponding colors onto a recording paper sheet on the transfer belt 2080. Finally, the fixing unit 2030 fixes the resulting image on the recording paper sheet.

The optical scanning apparatus 2010 may include a color light source similar to that of one of the surface-emitting laser devices 100, 100A, 100B, and similar to that of the surface-emitting laser array 100C. With this, the optical scanning apparatus can obtain a similar effect to the optical scanning apparatus 1010.

Sometimes, the color printer 2000 may experience a color deviation caused by a fabrication error or position error of a component. Even in such a case, if the light source of the optical scanning apparatus 2010 includes a surface-emitting laser array similar to the surface-emitting laser array 100C, it is possible to reduce the color deviation by selecting an illuminating light-emitting part.

As described above, a surface-emitting laser device of the present invention is able to stabilize a polarization direction, while controlling a high-order transverse mode oscillation. Moreover, a surface-emitting laser array of the present invention is suitable to stabilize a polarization direction, while controlling a high-order transverse mode oscillation. Furthermore, an optical scanning apparatus of the present invention is adapted to perform stable optical scanning. In addition, an image forming apparatus of the present invention is suitable to form a high-quality image.

The present invention is not limited to the specifically disclosed embodiments, and variations and modifications may be made without departing from the scope of the present invention.

The present application is based on Japanese Priority Patent Application No. 2008-302450, filed on Nov. 27, 2008, and Japanese Priority Patent Application No. 2009-122907, filed on May 21, 2009, the entire contents of which are incorporated herein by reference.

The invention claimed is:

1. A surface-emitting laser device configured to emit laser light in a direction perpendicular to a substrate and to include a current passing area in a mesa structure comprising:
    an electrode configured to surround an emitting area larger than the current passing area and to be provided on an emitting surface from which the laser light is emitted in the mesa structure,
    wherein a low reflectance area in the emitting area has shape anisotropy in two mutually perpendicular directions, and
    wherein a high reflectance area having higher reflectance than the low reflectance area in the emitting area is provided outside the current passing area from the direction perpendicular to the substrate in the emitting area.

2. The surface-emitting laser device as claimed in claim 1, wherein a normal direction of a principal surface of the substrate slopes toward one of directions of a crystal orientation <1 1 1>, from one of directions of a crystal orientation <1 0 0>.

3. The surface-emitting laser device as claimed in claim 1, wherein a center part of the emitting area is covered with a dielectric film and an optical thickness of the dielectric film is an even multiple of ¼ of an oscillation wavelength.

4. The surface-emitting laser device as claimed in claim 1, wherein the emitting surface is a top surface of the mesa structure, and a side surface of the mesa structure is covered with a dielectric film.

5. A surface-emitting laser array comprising a plurality of surface-emitting laser devices as claimed in claim 1.

6. An optical scanning apparatus configured to scan a surface to be scanned by laser light comprising:
    a light source including a surface-emitting laser device as claimed in claim 1;
    a deflection unit to deflect the laser light from the light source; and
    an optical scanning system to focus the laser light deflected by the deflection unit on the surface to be scanned.

7. An optical scanning apparatus configured to scan a surface to be scanned by laser light comprising:
    a light source including the surface-emitting laser array as claimed in claim 5;
    a deflection unit to deflect the laser light from the light source; and
    an optical scanning system to focus the laser light deflected by the deflection unit on the surface to be scanned.

8. An image forming apparatus comprising:
    at least one image holding body; and
    at least one optical scanning apparatus as claimed in claim 7 configured to scan the at least one image holding body with laser light modulated according to image information.

* * * * *